United States Patent
Ghadiri Moghaddam et al.

(10) Patent No.: US 11,143,430 B2
(45) Date of Patent: Oct. 12, 2021

(54) USING LIQUID TO AIR MEMBRANE ENERGY EXCHANGER FOR LIQUID COOLING

(71) Applicant: Nortek Air Solutions Canada, Inc., Saskatoon (CA)

(72) Inventors: Davood Ghadiri Moghaddam, Portland, OR (US); Philip Paul LePoudre, Saskatoon (CA); Manfred Gerber, Saskatoon (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 0 days.

(21) Appl. No.: 15/574,201

(22) PCT Filed: Mar. 8, 2016

(86) PCT No.: PCT/CA2016/050252
§ 371 (c)(1),
(2) Date: Nov. 15, 2017

(87) PCT Pub. No.: WO2016/183667
PCT Pub. Date: Nov. 24, 2016

(65) Prior Publication Data
US 2018/0135880 A1    May 17, 2018

Related U.S. Application Data

(60) Provisional application No. 62/162,487, filed on May 15, 2015.

(51) Int. Cl.
*F24H 3/02*     (2006.01)
*F24F 12/00*    (2006.01)
(Continued)

(52) U.S. Cl.
CPC ........... *F24F 12/00* (2013.01); *F24F 3/1411* (2013.01); *F24F 5/0003* (2013.01);
(Continued)

(58) Field of Classification Search
CPC .. F24F 12/00; F24F 11/63; F24F 11/46; F24F 11/83; F24F 3/1411; F24F 5/0003;
(Continued)

(56) References Cited

U.S. PATENT DOCUMENTS 1,015,831 A    1/1912    Pielock et al.
2,186,844 A    1/1940    Smith
(Continued)

FOREIGN PATENT DOCUMENTS

AU    2011286700 A1    12/2012
AU    2014231672 B2    3/2018
(Continued)

OTHER PUBLICATIONS

US 10,739,032 B2, 08/2020, LePoudre et al. (withdrawn)
(Continued)

*Primary Examiner* — Davis D Hwu
(74) *Attorney, Agent, or Firm* — Schwegman Lundberg & Woessner, P.A.

(57) ABSTRACT

Systems and methods for controlling conditions in an enclosed space, such as a data center, or for providing cooling to a device, can include using a Liquid-to-Air Membrane Energy Exchanger (LAMEE) as an evaporative cooler. The LAMEE or exchanger can cool water to the outdoor air wet bulb temperature in a cooling system disposed outside of the enclosed space or device. The reduced-temperature water can be delivered to the enclosed space or device or can cool a coolant that is delivered to the enclosed space or device. The air in the enclosed space, or one or more components in the enclosed space, can be cooled by
(Continued)

delivering the reduced-temperature water or coolant to the enclosed space, rather than moving the supply air from the enclosed space to the cooling system. In an example, the cooling system can include one or more cooling coils, upstream or downstream of the LAMEE.

18 Claims, 9 Drawing Sheets

(51) Int. Cl.
| | |
|---|---|
| F24F 13/30 | (2006.01) |
| H05K 7/20 | (2006.01) |
| F24F 3/14 | (2006.01) |
| F24F 5/00 | (2006.01) |
| F24F 11/46 | (2018.01) |
| F24F 11/83 | (2018.01) |
| F28D 15/00 | (2006.01) |
| F24F 11/63 | (2018.01) |
| F24F 110/10 | (2018.01) |
| F24F 11/00 | (2018.01) |

(52) U.S. Cl.
CPC ............ *F24F 5/0035* (2013.01); *F24F 11/46* (2018.01); *F24F 11/63* (2018.01); *F24F 11/83* (2018.01); *F24F 12/002* (2013.01); *F24F 12/003* (2013.01); *F24F 13/30* (2013.01); *F28D 15/00* (2013.01); *H05K 7/2079* (2013.01); *H05K 7/20745* (2013.01); *F24F 2003/1435* (2013.01); *F24F 2011/0006* (2013.01); *F24F 2012/005* (2013.01); *F24F 2110/10* (2018.01); *F24F 2203/02* (2013.01); *F24F 2203/026* (2013.01); *F24F 2203/104* (2013.01); *Y02B 30/52* (2013.01); *Y02B 30/56* (2013.01)

(58) Field of Classification Search
CPC ........ F24F 5/0035; F24F 12/002; F24F 12/12; F24F 12/003; F24F 13/30; F24F 15/00; F24F 2110/10; F24F 2003/1435; F24F 3/1417; F24F 3/147; H05K 7/20745; H05K 7/2079
USPC ......................................................... 165/54
See application file for complete search history.

(56) References Cited

U.S. PATENT DOCUMENTS

| | | |
|---|---|---|
| 2,290,465 A | 7/1942 | Crawford et al. |
| 2,562,811 A | 7/1951 | Muffly |
| 2,946,201 A | 7/1960 | Munters |
| 2,968,165 A | 1/1961 | Norbäck |
| 3,009,684 A | 11/1961 | Munters |
| 3,018,231 A | 1/1962 | Valentine et al. |
| 3,144,901 A | 8/1964 | Meek |
| 3,247,679 A | 4/1966 | Meckler |
| 3,291,206 A | 12/1966 | Nicholson |
| 3,401,530 A | 9/1968 | Meckler |
| 3,467,072 A | 9/1969 | Toesca |
| 3,735,559 A | 5/1973 | Salemme |
| 4,011,731 A | 3/1977 | Meckler |
| 4,113,004 A | 9/1978 | Rush et al. |
| 4,180,985 A | 1/1980 | Northrup, Jr. |
| 4,233,796 A | 11/1980 | Mazzoni et al. |
| 4,235,081 A | 11/1980 | Dowling |
| 4,257,169 A | 3/1981 | Pierce |
| 4,259,849 A | 4/1981 | Griffiths |
| 4,373,347 A | 2/1983 | Howell et al. |
| 4,380,910 A | 4/1983 | Hood et al. |
| 4,430,864 A | 2/1984 | Mathiprakasam |
| 4,474,021 A | 10/1984 | Harband |
| 4,538,426 A | 9/1985 | Bock |
| 4,594,860 A | 6/1986 | Coellner et al. |
| 4,691,530 A | 9/1987 | Meckler |
| 4,700,550 A | 10/1987 | Rhodes |
| 4,719,761 A | 1/1988 | Cromer |
| 4,723,417 A | 2/1988 | Meckler |
| 4,729,428 A | 3/1988 | Yasutake et al. |
| 4,729,774 A | 3/1988 | Cohen et al. |
| 4,841,733 A | 6/1989 | Dussault et al. |
| 4,887,438 A | 12/1989 | Meckler |
| 4,900,448 A | 2/1990 | Bonne et al. |
| 4,905,479 A | 3/1990 | Wilkinson |
| 4,909,810 A | 3/1990 | Nakao et al. |
| 4,930,322 A | 6/1990 | Ashley et al. |
| 4,936,107 A | 6/1990 | Kitagaki et al. |
| 4,939,906 A | 7/1990 | Spatz et al. |
| 4,941,324 A | 7/1990 | Peterson et al. |
| 4,982,575 A | 1/1991 | Besik |
| 5,003,961 A | 4/1991 | Besik |
| 5,020,334 A | 6/1991 | Wilkinson |
| 5,020,335 A | 6/1991 | Albers et al. |
| 5,022,241 A | 6/1991 | Wilkinson |
| 5,120,445 A | 6/1992 | Colman |
| 5,131,238 A | 7/1992 | Meckler |
| 5,148,374 A | 9/1992 | Coellner |
| 5,170,633 A | 12/1992 | Kaplan |
| 5,176,005 A | 1/1993 | Kaplan |
| 5,181,387 A | 1/1993 | Meckler |
| 5,191,771 A | 3/1993 | Meckler |
| 5,297,398 A | 3/1994 | Meckler |
| 5,311,929 A | 5/1994 | Verret |
| 5,325,676 A | 7/1994 | Meckler |
| 5,337,574 A | 8/1994 | Dick |
| 5,351,497 A | 10/1994 | Lowenstein |
| 5,353,606 A | 10/1994 | Yoho et al. |
| 5,373,704 A | 12/1994 | Mcfadden |
| 5,387,376 A | 2/1995 | Gasser |
| 5,448,895 A | 9/1995 | Coellner et al. |
| 5,471,852 A | 12/1995 | Meckler |
| 5,482,625 A | 1/1996 | Shimizu et al. |
| 5,496,397 A | 3/1996 | Fischer et al. |
| 5,502,975 A | 4/1996 | Brickley et al. |
| 5,517,828 A | 5/1996 | Calton et al. |
| 5,526,651 A | 6/1996 | Worek et al. |
| 5,542,968 A | 8/1996 | Belding et al. |
| 5,551,245 A | 9/1996 | Calton et al. |
| 5,564,281 A | 10/1996 | Calton et al. |
| 5,579,647 A | 12/1996 | Calton et al. |
| 5,580,369 A | 12/1996 | Belding et al. |
| 5,632,954 A | 5/1997 | Coellner et al. |
| 5,638,900 A | 6/1997 | Lowenstein et al. |
| 5,649,428 A | 7/1997 | Calton et al. |
| 5,650,221 A | 7/1997 | Belding et al. |
| 5,653,115 A | 8/1997 | Brickley et al. |
| 5,660,048 A | 8/1997 | Belding et al. |
| 5,661,983 A | 9/1997 | Groten et al. |
| 5,685,897 A | 11/1997 | Belding et al. |
| 5,701,762 A | 12/1997 | Akamatsu et al. |
| 5,718,286 A | 2/1998 | Damsohn et al. |
| 5,727,394 A | 3/1998 | Belding et al. |
| 5,732,562 A | 3/1998 | Moratalla |
| 5,749,230 A | 5/1998 | Coellner et al. |
| 5,758,508 A | 6/1998 | Belding et al. |
| 5,758,511 A | 6/1998 | Yoho et al. |
| 5,761,915 A | 6/1998 | Rao |
| 5,761,923 A | 6/1998 | Maeda |
| 5,791,153 A | 8/1998 | Belding et al. |
| 5,791,157 A | 8/1998 | Maeda |
| 5,816,065 A | 10/1998 | Maeda |
| 5,825,641 A | 10/1998 | Mangtani |
| 5,826,434 A | 10/1998 | Belding et al. |
| 5,826,641 A | 10/1998 | Bierwirth et al. |
| 5,832,736 A | 11/1998 | Yoshioka et al. |
| 5,860,284 A | 1/1999 | Goland et al. |
| 5,890,372 A | 4/1999 | Belding et al. |
| 5,911,273 A | 6/1999 | Brenner et al. |
| 5,931,016 A | 8/1999 | Yoho |
| 5,943,874 A | 8/1999 | Maeda |
| 5,946,931 A | 9/1999 | Lomax et al. |

(56) References Cited

U.S. PATENT DOCUMENTS

| | | |
|---|---|---|
| 5,950,447 A | 9/1999 | Maeda et al. |
| 5,992,160 A | 11/1999 | Bussjager et al. |
| 6,003,327 A | 12/1999 | Belding et al. |
| 6,018,953 A | 2/2000 | Belding et al. |
| 6,018,954 A | 2/2000 | Assaf |
| 6,029,462 A | 2/2000 | Denniston |
| 6,029,467 A | 2/2000 | Moratalla |
| 6,050,100 A | 4/2000 | Belding et al. |
| 6,079,481 A | 6/2000 | Lowenstein et al. |
| 6,094,835 A | 8/2000 | Cromer |
| 6,138,470 A | 10/2000 | Potnis et al. |
| 6,141,979 A | 11/2000 | Dunlap |
| 6,145,588 A | 11/2000 | Martin et al. |
| 6,156,102 A | 12/2000 | Conrad et al. |
| 6,176,101 B1 | 1/2001 | Lowenstein |
| 6,178,762 B1 | 1/2001 | Flax |
| 6,199,388 B1 | 3/2001 | Fischer |
| 6,199,392 B1 | 3/2001 | Maeda |
| 6,237,354 B1 | 5/2001 | Cromer |
| 6,269,650 B1 | 8/2001 | Shaw |
| 6,318,106 B1 | 11/2001 | Maeda |
| RE37,464 E | 12/2001 | Meckler |
| 6,363,218 B1 | 3/2002 | Lowenstein et al. |
| 6,412,295 B2 | 7/2002 | Weiss et al. |
| 6,442,951 B1 | 9/2002 | Maeda et al. |
| 6,494,053 B1 | 12/2002 | Forkosh |
| 6,497,107 B2 | 12/2002 | Maisotsenko et al. |
| 6,532,763 B1 | 3/2003 | Gupte |
| 6,546,746 B2 | 4/2003 | Forkosh et al. |
| 6,568,466 B2 | 5/2003 | Lowenstein et al. |
| 6,575,228 B1 | 6/2003 | Ragland et al. |
| 6,598,862 B2 | 7/2003 | Merrill et al. |
| 6,635,104 B2 | 10/2003 | Komkova et al. |
| 6,644,059 B2 | 11/2003 | Maeda et al. |
| 6,684,649 B1 | 2/2004 | Thompson |
| 6,709,492 B1 | 3/2004 | Spadaccini et al. |
| 6,720,990 B1 | 4/2004 | Walker et al. |
| 6,739,142 B2 | 5/2004 | Korin |
| 6,745,826 B2 | 6/2004 | Lowenstein et al. |
| 6,751,964 B2 | 6/2004 | Fischer |
| 6,800,118 B2 | 10/2004 | Kusunose et al. |
| 6,841,601 B2 | 1/2005 | Serpico et al. |
| 6,848,265 B2 | 2/2005 | Lowenstein et al. |
| 6,854,278 B2 | 2/2005 | Maisotsenko et al. |
| 6,864,005 B2 | 3/2005 | Mossman |
| 6,935,416 B1 | 8/2005 | Tsunoda et al. |
| 6,973,795 B1 | 12/2005 | Moffitt |
| 6,976,365 B2 | 12/2005 | Forkosh et al. |
| 6,978,633 B2 | 12/2005 | Yamazaki |
| 7,000,427 B2 | 2/2006 | Mathias et al. |
| 7,017,356 B2 | 3/2006 | Moffitt |
| 7,092,006 B2 | 8/2006 | Walker et al. |
| 7,093,452 B2 | 8/2006 | Chee et al. |
| 7,093,649 B2 | 8/2006 | Dawson |
| RE39,288 E | 9/2006 | Assaf |
| 7,178,355 B2 | 2/2007 | Moffitt |
| 7,181,918 B2 | 2/2007 | Reinders et al. |
| 7,231,967 B2 | 6/2007 | Haglid |
| 7,269,966 B2 | 9/2007 | Lowenstein et al. |
| 7,306,650 B2 | 12/2007 | Slayzak et al. |
| 7,331,376 B2 | 2/2008 | Gagnon et al. |
| 7,340,906 B2 | 3/2008 | Moffitt |
| 7,389,646 B2 | 6/2008 | Moffitt |
| 7,389,652 B1 | 6/2008 | Fair |
| 7,593,033 B2 | 9/2009 | Walker et al. |
| 7,602,414 B2 | 10/2009 | Walker et al. |
| 7,605,840 B2 | 10/2009 | Walker et al. |
| 7,717,404 B2 | 5/2010 | Hasegawa et al. |
| 7,719,565 B2 | 5/2010 | Walker et al. |
| 7,737,224 B2 | 6/2010 | Willis et al. |
| 7,753,991 B2 | 7/2010 | Kertzman |
| 7,781,034 B2 | 8/2010 | Yializis et al. |
| 7,817,182 B2 | 10/2010 | Walker et al. |
| D638,925 S | 5/2011 | Charlebois et al. |
| 7,942,387 B2 | 5/2011 | Forkosh |
| 7,966,841 B2 | 6/2011 | Lowenstein et al. |
| 8,002,023 B2 | 8/2011 | Murayama |
| 8,033,532 B2 | 10/2011 | Yabu |
| 8,137,436 B2 | 3/2012 | Calis et al. |
| 8,157,891 B2 | 4/2012 | Montie et al. |
| 8,318,824 B2 | 11/2012 | Matsuoka et al. |
| 8,469,782 B1 | 6/2013 | Roy |
| 8,550,151 B2 | 10/2013 | Murayama et al. |
| 8,769,971 B2 | 7/2014 | Kozubal et al. |
| 8,783,053 B2 | 7/2014 | McCann |
| 8,887,523 B2 | 11/2014 | Gommed et al. |
| 8,899,061 B2 | 12/2014 | Reytblat |
| 8,915,092 B2 | 12/2014 | Gerber et al. |
| 8,920,699 B2 | 12/2014 | Marutani et al. |
| 8,943,848 B2 | 2/2015 | Phannavong et al. |
| 8,966,924 B2 | 3/2015 | Pichai |
| 9,021,821 B2 | 5/2015 | Dunnavant |
| 9,027,764 B2 | 5/2015 | Murutani et al. |
| 9,109,808 B2 | 8/2015 | Gerber et al. |
| 9,188,349 B2 | 11/2015 | Warmerdam et al. |
| 9,234,665 B2 * | 1/2016 | Erb .................. F24F 3/1417 |
| 9,243,810 B2 | 1/2016 | Vandermeulen et al. |
| 9,273,877 B2 | 3/2016 | Vandermeulen |
| 9,429,332 B2 | 8/2016 | Vandermeulen et al. |
| 9,810,439 B2 | 11/2017 | Coutu et al. |
| 9,816,760 B2 | 11/2017 | LePoudre et al. |
| 9,909,768 B2 | 3/2018 | Gerber et al. |
| 10,197,310 B2 | 2/2019 | Ghadiri Moghaddam et al. |
| 10,782,045 B2 | 9/2020 | LePoudre et al. |
| 10,808,951 B2 | 10/2020 | LePoudre et al. |
| 2001/0003902 A1 | 6/2001 | Kopko |
| 2002/0005271 A1 | 1/2002 | Weiss et al. |
| 2002/0038552 A1 | 4/2002 | Maisotsenko et al. |
| 2003/0014983 A1 | 1/2003 | Maisotsenko et al. |
| 2003/0037905 A1 | 2/2003 | Weng |
| 2003/0070787 A1 | 4/2003 | Moffitt |
| 2003/0121271 A1 | 7/2003 | Dinnage et al. |
| 2004/0000152 A1 | 1/2004 | Fischer |
| 2004/0061245 A1 | 4/2004 | Maisotsenko et al. |
| 2004/0134211 A1 | 7/2004 | Lee et al. |
| 2004/0134212 A1 | 7/2004 | Lee et al. |
| 2004/0168462 A1 | 9/2004 | Assaf |
| 2004/0226685 A1 | 11/2004 | Gagnon et al. |
| 2005/0056042 A1 | 3/2005 | Bourne et al. |
| 2005/0072303 A1 | 4/2005 | Weidenmann |
| 2005/0230080 A1 | 10/2005 | Paul et al. |
| 2005/0249901 A1 | 11/2005 | Yializis et al. |
| 2005/0262862 A1 | 12/2005 | Moffitt |
| 2006/0021615 A1 | 2/2006 | Kertzman |
| 2006/0032258 A1 | 2/2006 | Pruitt et al. |
| 2006/0042295 A1 | 3/2006 | Assaf |
| 2006/0205301 A1 | 9/2006 | Klare et al. |
| 2007/0029685 A1 | 2/2007 | Lin |
| 2007/0056894 A1 | 3/2007 | Connors, Jr. |
| 2007/0095519 A1 | 5/2007 | Hombucher |
| 2007/0234743 A1 | 10/2007 | Assaf |
| 2007/0279861 A1 | 12/2007 | Doll et al. |
| 2008/0023182 A1 | 1/2008 | Beamer et al. |
| 2008/0066888 A1 | 3/2008 | Tong et al. |
| 2008/0085437 A1 | 4/2008 | Dean et al. |
| 2008/0099184 A1 | 5/2008 | Han |
| 2008/0283217 A1 | 11/2008 | Gagnon et al. |
| 2009/0095162 A1 | 4/2009 | Hargis et al. |
| 2009/0126913 A1 | 5/2009 | Lee et al. |
| 2009/0133866 A1 | 5/2009 | Campbell et al. |
| 2009/0193974 A1 | 8/2009 | Montie et al. |
| 2009/0294110 A1 | 12/2009 | Foust |
| 2009/0324929 A1 | 12/2009 | Yamakawa et al. |
| 2010/0090356 A1 | 4/2010 | Sines et al. |
| 2010/0170655 A1 | 7/2010 | Kronvall et al. |
| 2010/0170776 A1 | 7/2010 | Ehrenberg et al. |
| 2010/0192605 A1 | 8/2010 | Fang et al. |
| 2010/0200068 A1 | 8/2010 | D'arcy et al. |
| 2010/0275629 A1 | 11/2010 | Erickson |
| 2010/0300123 A1 | 12/2010 | Park et al. |
| 2010/0319370 A1 | 12/2010 | Kozubal et al. |
| 2011/0056384 A1 | 3/2011 | Kadota |
| 2011/0192579 A1 | 8/2011 | Sotokawa et al. |
| 2011/0223486 A1 | 9/2011 | Zhang et al. |

(56) References Cited

U.S. PATENT DOCUMENTS

| | | |
|---|---|---|
| 2011/0232485 A1 | 9/2011 | Ellsworth |
| 2011/0232633 A1 | 9/2011 | Lima |
| 2011/0259572 A1 | 10/2011 | Muratani et al. |
| 2011/0308265 A1 | 12/2011 | Phannavong et al. |
| 2012/0000227 A1 | 1/2012 | Matsuura et al. |
| 2012/0016700 A1 | 1/2012 | Jabbour et al. |
| 2012/0031133 A1 | 2/2012 | Kuwabara et al. |
| 2012/0061045 A1 | 3/2012 | Huizing |
| 2012/0073791 A1 | 3/2012 | Dubois |
| 2012/0085112 A1 | 4/2012 | Wintemute |
| 2012/0106073 A1 | 5/2012 | Wu et al. |
| 2012/0125020 A1 | 5/2012 | Vandermeulen et al. |
| 2012/0125021 A1 | 5/2012 | Vandermeulen et al. |
| 2012/0125023 A1 | 5/2012 | Kopko et al. |
| 2012/0125031 A1 | 5/2012 | Vandermeulen et al. |
| 2012/0125405 A1 | 5/2012 | Vandermeulen et al. |
| 2012/0125581 A1 | 5/2012 | Allen et al. |
| 2012/0131934 A1 | 5/2012 | Vandermeulen et al. |
| 2012/0131937 A1 | 5/2012 | Vandermeulen et al. |
| 2012/0131938 A1 | 5/2012 | Vandermeulen et al. |
| 2012/0131939 A1 | 5/2012 | Vandermeulen et al. |
| 2012/0131940 A1 | 5/2012 | Vandermeulen et al. |
| 2012/0132513 A1 | 5/2012 | Vandermeulen et al. |
| 2012/0162918 A1 | 6/2012 | Thyni et al. |
| 2012/0167600 A1 | 7/2012 | Dunnavant |
| 2012/0168369 A1 | 7/2012 | Van Medevoort et al. |
| 2012/0180505 A1 | 7/2012 | Gerber et al. |
| 2012/0186281 A1 | 7/2012 | Vandermeulen et al. |
| 2012/0247132 A1 | 10/2012 | Lakdawala et al. |
| 2012/0298340 A1 | 11/2012 | Al-Otaibi |
| 2013/0029148 A1 | 1/2013 | Carney et al. |
| 2013/0056177 A1 | 3/2013 | Coutu et al. |
| 2013/0186121 A1 | 7/2013 | Erb et al. |
| 2013/0199220 A1 | 8/2013 | Ma et al. |
| 2013/0240438 A1 | 9/2013 | Willis et al. |
| 2013/0248147 A1 | 9/2013 | Wintemute et al. |
| 2013/0283837 A1 | 10/2013 | Takahashi et al. |
| 2013/0340449 A1 | 12/2013 | Kozubal et al. |
| 2014/0054004 A1 | 2/2014 | LePoudre et al. |
| 2014/0054013 A1 | 2/2014 | Lepoudre et al. |
| 2014/0083648 A1 | 3/2014 | Wawryk |
| 2014/0138851 A1 | 5/2014 | Kim et al. |
| 2014/0190037 A1 | 7/2014 | Erb et al. |
| 2014/0190198 A1 | 7/2014 | Slessman et al. |
| 2014/0245769 A1 | 9/2014 | Vandermeulen et al. |
| 2014/0260367 A1 | 9/2014 | Coutu et al. |
| 2014/0260369 A1* | 9/2014 | LePoudre .............. F24F 5/0035 62/91 |
| 2014/0260373 A1 | 9/2014 | Gerber et al. |
| 2014/0260399 A1 | 9/2014 | Vandermeulen |
| 2014/0262125 A1 | 9/2014 | Erb et al. |
| 2014/0262144 A1 | 9/2014 | Erb et al. |
| 2014/0326433 A1 | 11/2014 | Kozubal |
| 2014/0340842 A1 | 11/2014 | Towner et al. |
| 2015/0096714 A1 | 4/2015 | Dagley |
| 2015/0184876 A1 | 7/2015 | Vandermeulen et al. |
| 2015/0292754 A1 | 10/2015 | Mongar |
| 2015/0323203 A1 | 11/2015 | Gerber et al. |
| 2016/0054012 A1 | 2/2016 | Lepoudre et al. |
| 2016/0084512 A1 | 3/2016 | Blake et al. |
| 2016/0187010 A1 | 6/2016 | Vandermeulen |
| 2016/0209087 A1 | 7/2016 | Reytblat et al. |
| 2016/0290666 A1 | 10/2016 | Coutu et al. |
| 2016/0298865 A1 | 10/2016 | Gerber et al. |
| 2016/0327345 A1 | 11/2016 | Lowenstein |
| 2017/0241655 A1 | 8/2017 | Lepoudre et al. |
| 2018/0073753 A1 | 3/2018 | Lepoudre et al. |
| 2018/0128510 A1 | 5/2018 | Lepoudre et al. |
| 2018/0135880 A1 | 5/2018 | Ghadiri Moghaddam et al. |
| 2018/0187918 A1 | 7/2018 | Lepoudre et al. |
| 2019/0113247 A1 | 4/2019 | Lepoudre et al. |

FOREIGN PATENT DOCUMENTS

| | | |
|---|---|---|
| AU | 2015230799 B2 | 3/2018 |
| AU | 2013305427 B2 | 4/2018 |
| AU | 2014231681 B2 | 6/2018 |
| AU | 2013305428 B2 | 9/2018 |
| CA | 2283089 A1 | 11/2000 |
| CA | 2801352 A1 | 12/2011 |
| CA | 2798928 A1 | 2/2012 |
| CA | 2843763 A1 | 3/2013 |
| CA | 2904224 A1 | 9/2014 |
| CH | 193732 A | 10/1937 |
| CN | 1163389 A | 10/1997 |
| CN | 1343292 A | 4/2002 |
| CN | 1456855 A | 11/2003 |
| CN | 1517610 A | 8/2004 |
| CN | 1518477 A | 8/2004 |
| CN | 1666081 A | 9/2005 |
| CN | 1711448 A | 12/2005 |
| CN | 200958820 Y | 10/2007 |
| CN | 101368754 | 2/2009 |
| CN | 201203217 Y | 3/2009 |
| CN | 101405559 A | 4/2009 |
| CN | 101421580 A | 4/2009 |
| CN | 101469090 A | 7/2009 |
| CN | 101918777 A | 12/2010 |
| CN | 102076401 A | 5/2011 |
| CN | 201906567 U | 7/2011 |
| CN | 102149979 A | 8/2011 |
| CN | 102165268 A | 8/2011 |
| CN | 102232015 A | 11/2011 |
| CN | 102345909 A | 2/2012 |
| CN | 102395419 A | 3/2012 |
| CN | 102548727 A | 7/2012 |
| CN | 102549361 A | 7/2012 |
| CN | 102933931 A | 2/2013 |
| CN | 103069246 A | 4/2013 |
| CN | 103245018 A | 8/2013 |
| CN | 203116208 U | 8/2013 |
| CN | 103827595 A | 5/2014 |
| CN | 104048434 A | 9/2014 |
| CN | 203893703 | 10/2014 |
| CN | 104136855 | 11/2014 |
| CN | 104583706 A | 4/2015 |
| CN | 103261801 B | 11/2015 |
| CN | 105121989 A | 12/2015 |
| CN | 105164474 A | 12/2015 |
| CN | 105164484 A | 12/2015 |
| CN | 105202795 A | 12/2015 |
| CN | 105283715 A | 1/2016 |
| CN | 101512238 A | 8/2016 |
| CN | 107249715 A | 10/2017 |
| CN | 107300230 A | 10/2017 |
| CN | 107560482 A | 1/2018 |
| CN | 107850335 A | 3/2018 |
| CN | 107923647 A | 4/2018 |
| CN | 108027221 A | 5/2018 |
| CN | 109073265 A | 12/2018 |
| CN | 107850335 B | 2/2021 |
| DE | 10143092 A1 | 3/2003 |
| EP | 0448991 A2 | 10/1991 |
| EP | 0661502 A2 | 7/1995 |
| EP | 0678321 A2 | 10/1995 |
| EP | 1108575 A1 | 6/2001 |
| EP | 2397787 A2 | 12/2011 |
| EP | 2751493 B1 | 3/2018 |
| FR | 2291457 A1 | 6/1976 |
| GB | 1354502 A | 6/1974 |
| GB | 2015384 A | 9/1979 |
| IN | 201717044889 A | 3/2018 |
| IN | 201717044890 A | 3/2018 |
| IN | 201817002765 A | 4/2018 |
| IN | 201817037404 | 12/2018 |
| JP | 6152594 A | 3/1986 |
| JP | 05157282 A | 6/1993 |
| JP | 09196482 A | 7/1997 |
| JP | 10170177 A | 6/1998 |
| JP | 2004116419 A | 4/2004 |
| JP | 2004257588 A | 9/2004 |

(56) References Cited

FOREIGN PATENT DOCUMENTS

| | | |
|---|---|---|
| JP | 2008070046 A | 3/2008 |
| JP | 2009275955 A | 11/2009 |
| KR | 100607204 B1 | 8/2006 |
| SG | 10201809840V | 12/2018 |
| SG | 11201807692V | 2/2020 |
| SG | 10201913923WA | 3/2020 |
| TW | I271499 B | 1/2007 |
| WO | WO-9641107 A1 | 12/1996 |
| WO | WO-1996041107 A1 | 12/1996 |
| WO | WO-1999014535 A1 | 3/1999 |
| WO | WO-0135039 A1 | 5/2001 |
| WO | WO-0171260 A1 | 9/2001 |
| WO | WO-03049835 A1 | 6/2003 |
| WO | WO-2004065875 A1 | 8/2004 |
| WO | WO-2008037079 A1 | 4/2008 |
| WO | WO-2008053367 A2 | 5/2008 |
| WO | WO-2008089484 A1 | 7/2008 |
| WO | WO-2009000974 A1 | 12/2008 |
| WO | WO-2009094032 A1 | 7/2009 |
| WO | WO-2009158030 A1 | 12/2009 |
| WO | WO-2010006968 A1 | 1/2010 |
| WO | WO-2011062808 A1 | 5/2011 |
| WO | WO-2011161547 A2 | 12/2011 |
| WO | WO-2011161547 A3 | 12/2011 |
| WO | WO-2012018089 A1 | 2/2012 |
| WO | WO-2012042553 A1 | 4/2012 |
| WO | WO-2012087273 A1 | 6/2012 |
| WO | WO-2012097445 A1 | 7/2012 |
| WO | WO-2012167366 A1 | 12/2012 |
| WO | WO-2013029148 A1 | 3/2013 |
| WO | WO-2013094206 A1 | 6/2013 |
| WO | WO-2013107554 A1 | 7/2013 |
| WO | WO-2013192397 A1 | 12/2013 |
| WO | WO-2014029003 A1 | 2/2014 |
| WO | WO-2014029004 A1 | 2/2014 |
| WO | WO-2014107790 A1 | 7/2014 |
| WO | 2014138851 | 9/2014 |
| WO | 2014142277 | 9/2014 |
| WO | WO-2014138846 A1 | 9/2014 |
| WO | WO-2014138847 A1 | 9/2014 |
| WO | WO-2014138859 A1 | 9/2014 |
| WO | WO-2014138860 A1 | 9/2014 |
| WO | 2015192249 | 12/2015 |
| WO | WO-2016026042 A1 | 2/2016 |
| WO | WO-2016183667 A1 | 11/2016 |
| WO | WO-2016183668 A1 | 11/2016 |
| WO | WO-2016207864 A1 | 12/2016 |
| WO | WO-2017152268 A1 | 9/2017 |

OTHER PUBLICATIONS

"Aaonaire Energy Recovery Units Users Information Manual", AAON, Inc., (Aug. 2006), 16 pgs.
"Advances in Desiccant-Based Dehumidification", American Standard, TRANE Engineers Newsletter, vol. 34-4, (2005), 8 pgs.
"U.S. Appl. No. 15/574,205, Response filed Jan. 11, 2019 to Non-Final Office Action dated Sep. 11, 2018", 12 pgs.
"Chapter 8—Heating, Ventilating, and Air Conditioning (HVAC) Demonstration", HVAC Demonstration, (published prior to Feb. 21, 2014), 16 pgs.
"Dehumidification Solutions", Des Champs Laboratories, Inc., (2001), 18 pgs.
"Desi-WringerTM Precision Desiccant Dehumidification Systems", Des Champs Technologies, (2007), 12 pgs.
"Energy Recovery—Fresh in Air Quality", SEMCO Inc., (published before Apr. 12, 2012), 131 pgs.
"European Application Serial No. 16795582.2, Extended European Search Report dated Nov. 20, 2018", 8 pgs.
"Meeting Programs", ASHRAE Technical Committee, (1997-2001), 13 pgs.
"Two-Wheel Desiccant Dehumidification System—Technology for Dehumidification and Improving Indoor Air Quality", Federal Technology Alert, (Apr. 1997), 24 pgs.

Abdel-Salam, Mohamed R. H., et al., "Performance testing of 2-fluid and 3-fluid liquid-to-air membrane energy exchangers for HVAC applications in cold-dry climates", International Journal of Heat and Mass Transfer, 106, (2017), 12 pgs.
Abdel-Salam, Mohamed R. H., et al., "Performance testing of a novel 3-fluid liquid-to-air membrane energy exchanger (3-fluid LAMEE) under desiccant solution regeneration operating conditions", International Journal of Heat and Mass Transfer, 95, (2015), 14 pgs.
Acker, William, "Industrial Dehumidification: Water Vapor Load Calculations and System Descriptions", HPAC Heating/Piping/Air Conditioning, (Mar. 1999), 49-59.
Bellia, L., et al., "Air Conditioning Systems with Desiccant Wheel for Italian Climates", International Journal on Architectural Science, vol. 1 No. 4, (2000), 193-213.
Bergero, Stefano, et al., "On the performances of a hybrid air-conditioning system in different climatic conditions", Energy 36(8), (2011), 5261-5273.
Bergero, Stefano, et al., "Performance analysis of a liquid desiccant and membrane contactor hybrid air-conditioning system", Energy and Buildings 42, (2010), 11 pgs.
Chant, Eileen E., et al., "A Steady-State Simulation of an Advanced Desiccant-Enhanced Cooling and Dehumidification System", ASHRAE Transactions: Research, (Jul. 1992), 339-347.
Coad, William J., "Conditioning Ventilation Air for Improved Performance and Air Quality", HPAC Heating/Piping/Air Conditioning, (Sep. 1999), 6 pgs.
Diblasio, Robert, "Desicants in Hospitals—Conditioning a Research Facility", Engineered Systems, (Sep. 1995), 4 pgs.
Downing, et al., "Operation and Maintenance for Quality Indoor Air", Proc. of the 7th Symposium on Improving Building Systems in Hot and Humid Climates, Ft. Worth, TX, (Oct. 9, 1990), 5 pgs.
Downing, Chris, "Humidity Control—No Place Like Home", Engineered Systems, (1996), 4 pgs.
Erb, Blake, et al., "Experimental Measurements of a Run-Around Membrane Energy Exchanger (RAMEE) with Comparison to a Numerical Model", ASHRAE Transactions, vol. 115, Part 2, (2009), 689-705.
Fischer, J., et al., "Active Desiccant Dehumidification Module Integration with Rooftop Packaged HVAC Units—Final Report Phase 3B", Oak Ridge National Laboratory, (Mar. 2002), 36 pgs.
Fischer, John C., "Optimizing IAQ, Humidity Control, and Energy Efficiency in School Environments through the Application of Desiccant-based Total Energy Recovery Systems", IAQ Atlanta: Paths to Better Building Environments/Environmental Effects on Heath and Productivity, (1996), 16 pgs.
Harriman, III, et al., "Dehumidification and Cooling Loads from Ventilation Air", ASHRAE Journal, (Nov. 1997), 7 pgs.
Harriman, III, et al., "Evaluating Active Desiccant Systems for Ventilating Commercial Buildings", ASHRAE Journal, (Oct. 1999), 7 pgs.
Harriman, III, et al., "New Weather Data for Energy Calculations", ASHRAE Journal, (Mar. 1999), 7 pgs.
Jeong, et al., "Energy Conservation Benefits of a Dedicated Outdoor Air System with Parallel Sensible Cooling by Ceiling Radiant Panels", ASHRAE Transactions, vol. 109, Part 2, (2003), 10 pgs.
Karniadakis, George E., et al., "Mimimum-dissipation transport enhancement by flow destabilization: Reynolds' analogy revisited", J. Fluid Mech vol. 192, (1988), 365-391.
Kosar, Douglas R., et al., "Dehumidification Issues of Standard 62-1989", ASHRAE Journal, (Mar. 1998), 71-75.
Larson, Michael David, et al., "The Performance of Membranes in a Newly Proposed Run-Around Heat and Moisture Exchanger", MS Thesis in Mechanical Engineering, University of Saskatchewan, Saskatoon, Canada, URL: http://libran.usask.ca/theses/available/etd-12192006-094159/umestricted/Larson Thesis.pdf, (Dec. 2006), 177 pgs.
Lepoudre, P., et al., "Channel Flow with Sinusoidal Screen Insert", Dept. of Mech Engineering, Univ. of Saskatchewan, Proc. of the 19th Annual Conference of the CFD Society of Canada, Montreal, (Apr. 2011), 6 pgs.
Mahmud, Khizir, "Design and Performance Testing of Counter-Cross-Flow Run-Around Membrane Energy Exchanger System",

(56) References Cited

OTHER PUBLICATIONS

MS Thesis in Mechanical Engineering, University of Saskatchewan, Saskatoon, Canada, URL: http://libranusask.ca/theses/ available/ etd-09092009-223833/umestricted/KhizirMahmud2009-Sep-28a. pdf, (Sep. 2009), 176 pgs.

Mahmud, Khizir, et al., "Performance testing of a counter-cross-flow run-around membrane energy exchanger (RAMEE) system for HVAC applications", Energy and Buildings, 42, (2010), 9 pgs.

Mcgahey, Kevin, et al., "Desiccants: Benefits for the Second Century of Air Conditioning", Proc. of the 10th Symposium on Improving Building Systems in Hot and Humid Climates, Ft. Worth, Texas, (May 14, 1996), 9 pgs.

Mcgahey, Kevin, "New Commercial Applications for Desiccant-Based Cooling", ASHRAE Journal, (Jul. 1998), 41-45.

Mumma, Stanley A., et al., "Achieving Dry Outside Air in an Energy-Efficient Manner", ASHRAE Transactions 2001, vol. 107, Part 1, (2001), 8 pgs.

Mumma, Stanley A., "Dedicated Outdoor Air-Dual Wheel System Control Requirements", ASHRAE Transactions, vol. 107, Part 1, (2001), 9 pgs.

Mumma, Stanley A., et al., "Extension of the Multiple Spaces Concept of ASH RAE Standard 62 to Include Infiltration, Exhaust/ Exfiltration, Interzonal Transfer, and Additional Short-Circuit Paths", ASHRAE Transactions: Symposia, (1998), 1232-1241.

Mumma, Stanley A, "Overview of Integrating Dedicated Outdoor Air Systems with Parallel Terminal Systems", ASHRAE Transactions vol. 107, Part 1, (2001), 7 pgs.

Nimmo, B. G., et al., "DEAC: Desiccant Enhancement of Cooling-Based Dehumidification", ASHRAE Transactions: Symposia, (1993), 842-848.

Qin, C. K., et al., "Engine-driven Desiccant-assisted Hybrid Air-conditioning System", 23rd World Gas Conference, Amsterdam, (2006), 15 pgs.

Ryan, K., et al., "Three-dimensional transition in the wake of bluff elongated cylinders", J. Fluid Mech., vol. 538, (2005), 29 pgs.

Scofield, C. Mike, et al., "HVAC Design for Classrooms: Divide and Conquer", Heating/Piping/Air Conditioning, (May 1993), 53-59.

Sevigny, Scoot P., et al., "Air Handling Unit Direct Digital Control System Retrofit to Provide Acceptable Indoor Air Quality and Global Energy Optimization", Energy Engineering, vol. 94, No. 5, (1997), 24-43.

Shank, Kurt M., et al., "Selecting the Supply Air Conditions for a Dedicated Outdoor Air System Working in Parallel with Distributed Sensible Cooling Terminal Equipment", ASHRAE Transactions, vol. 107, Part 1, (2001), 10 pgs.

Smith, Christopher S., et al., "Outdoor Air, Heat Wheels and JC Penny: A New Approach to Retail Ventilation", Proc. of the 11th Symposium on Improving Building Systems in Hot and Humid Climates, Ft. Worth, Texas, (Jun. 2, 1998), 1 pg.

Smith, James C., "Schools Resolve IAQ/Humidity Problems with Desiccant Preconditioning", Heating/Piping/Air Conditioning, (Apr. 1996), 6 pgs.

Sonin, Ain A., et al., "Optimization of Flow Design in Forced Flow Electrochemical Systems, with Special Application to Electrodialysis", Ind. Eng. Chem, Process Des. Develop vol. 13, No. 3, (1974), 8 pgs.

Swails, James F., et al., "A Cure for Growing Pains", Consulting Specifying Engineer, [Online] retrieved from the internet: www.csermag.com, (Jun. 1997), 4 pgs.

Turpin, Joanna, "Dehumidification: The Problem No One Wants to Talk About", URL: http//www.esmagazine.com/copyrighVde12c1c879ba801 0VgnVCM1 00000f932a8c0_?>, (posted on Apr. 5, 2000), 6 pgs.

Vali, Alireza, "Modeling a Run-Around Heat and Moisture Exchanger Using Two Counter/Cross Flow Exchangers", MS Thesis in Mechanical Engineering, University of Saskatchewan, Saskatoon, Canada, URL: http://library.usask.ca/theses/mailable/etd-06032009-15-J.6-J.-1./unrestricted/Vali.AlirezaThesis.pdf, (2009), 193 pgs.

Vali, Alireza, et al., "Numerical model and effectiveness correlations for a run-around heat recovery system with combined counter and cross flow exchangers", International Journal of Heat and Mass Transfer 52, (2009), 14 pgs.

Woods, J, et al., "Desiccant Enhanced Evaporative Air Conditioning: Parametric Analysis and Design", 2nd International Conference on Building Energy and Environment (COBEE), (Oct. 2012), 10 pgs.

Yborra, Stephen C., "Field Evaluation of Desiccant-Integrated HVAC Systems: A Review of Case Studies in Multiple Commercial/ Institutional Building Types", Proc. of the 11th Symposium on Improving Building Systems in Hot and Humid Climates, Ft. Worth, Texas, (Jun. 2, 1998), 10 pgs.

"U.S. Appl. No. 15/574,205, Non Final Office Action dated Sep. 11, 2018", 6 pgs.

"International Application Serial No. PCT/CA2016/050252, International Search Report dated May 26, 2016", 3 pgs.

"International Application Serial No. PCT/CA2016/050252, Written Opinion dated May 26, 2016", 4 pgs.

"International Application Serial No. PCT/CA2016/050507, International Search Report dated Jul. 21, 2016", 3 pgs.

"International Application Serial No. PCT/CA2016/050507, Written Opinion Jul. 21, 2016", 3 pgs.

"International Application Serial No. PCT/CA2017/050180, International Search Report dated Apr. 26, 2017", 3 pgs.

"International Application Serial No. PCT/CA2017/050180, Written Opinion dated Apr. 26, 2017", 4 pgs.

U.S. Appl. No. 15/574,205, filed Nov. 15, 2017, Systems and Methods for Managing Conditions in Enclosed Space.

U.S. Appl. No. 15/814,153, filed Nov. 15, 2017, Systems and Methods for Providing Cooling to a Heat Load.

U.S. Appl. No. 16/083,280, filed Sep. 7, 2018, Systems and Methods for Providing Cooling to a Heat Load.

"European Application Serial No. 16795581.4, Extended European Search Report dated Feb. 12, 2019", 9 pgs.

"Application Serial No. 15 574,205, Notice of Allowance dated Feb. 13, 2019", 6 pgs.

"Singaporean Application Seria No. 11201709404P, Written Opinion dated Feb. 22, 2019", in English, 8 pgs.

"European Application Serial No. 17762365.9, Response filed Apr. 25, 2019 to Communication Pursuant to Rules 161 and 162 dated Oct. 16, 2018", 12 pgs.

"International Application Serial No. PCT CA2015 050570, International Search Report dated Sep. 1, 2015", 5 pgs.

"Application Serial No. 15 814,153, Restriction Requirement dated May 15, 2019", 6 pgs.

"Oasis PFC Polymer Fluid Cooler Product Information", Munters Corp., (Nov. 2013), 2 pgs.

"Munters PFC Polymer Fluid Cooler", Munters Corp., (Sep. 2015), 2 pgs.

"U.S. Appl. No. 15/574,205, Non Final Office Action dated Jun. 17, 2019", 3 pgs.

"European Serial No. 16795582.2, Response filed Jun. 17, 2019 to Extended European Search Report dated Nov. 20, 2018", 16 pgs.

"Chinese Application Serial No. 201680038134.X, Office Action dated Jul. 8, 2019", w/o English Translation, 14 pgs.

"U.S. Appl. No. 15/814,153, Response filed Jul. 15, 2019 to Restriction Requirement dated May 15, 2019", 9 pgs.

"Singaporean Application Serial No. 11201709404P, Response filed Jul. 22, 2019 to Written Opinion dated Feb. 22, 2019", in English, 62 pgs.

"International Application Serial No. PCT CA2015 050570, Written Opinion dated Sep. 1, 2015", 4 pgs.

U.S. Appl. No. 14/830,492, filed Aug. 19, 2015, Liquid to Air Membrane Energy Exchangers.

U.S. Appl. No. 15/739,016, filed Dec. 21, 2017, Three-Fluid Liquid to Air Membrane Energy Exchanger.

U.S. Appl. No. 13/449,598, U.S. Pat. No. 9,810,439, filed Apr. 18, 2012, Energy Exchange System for Conditioning Air in an Enclosed Structure.

U.S. Appl. No. 15/185,180, filed Jun. 17, 2016, Energy Exchange System for Conditioning Air in an Enclosed Structure.

(56) References Cited

OTHER PUBLICATIONS

U.S. Appl. No. 13/702,596, U.S. Pat. No. 9,234,665, filed Apr. 15, 2013, Liquid-to-Air Membrane Energy Exchanger.
U.S. Appl. No. 14/957,795, filed Dec. 3, 2015, Liquid-to-Air Membrane Energy Exchanger.
U.S. Appl. No. 13/797,152, U.S. Pat. No. 9,816,760, filed Mar. 12, 2013, Liquid Panel Assembly.
U.S. Appl. No. 15/590,685, filed May 9, 2017, Liquid Panel Assembly.
U.S. Appl. No. 13/797,062, filed Mar. 12, 2013, Membrane Support Assembly for an Energy Exchanger.
U.S. Appl. No. 14/187,413, filed Feb. 24, 2014, Evaporative Cooling System With Liquid-to-Air Membrane Energy Exchanger.
U.S. Appl. No. 13/801,280, U.S. Pat. No. 9,109,808, filed Mar. 13, 2013, Variable Desiccant Control Energy Exchange System and Method.
U.S. Appl. No. 14/804,953, U.S. Pat. No. 9,909,768, filed Jul. 21, 2015, Variable Desiccant Control Energy Exchange System and Method.
U.S. Appl. No. 15/185,155, filed Jul. 17, 2016, Variable Desiccant Control Energy Exchange System and Method.
U.S. Appl. No. 14/192,019, filed Feb. 27, 2014, Energy Exchange Assembly With Microporous Membrane.
U.S. Appl. No. 14/190,715, filed Feb. 26, 2014, Membrane-Integrated Energy Exchange Assembly.
U.S. Appl. No. 14/171,951, filed Feb. 4, 2014, Control System and Method for a Liquid Desiccant Air Delivery System.
U.S. Appl. No. 10/048,797, U.S. Pat. No. 6,684,649, filed Jan. 31, 2002, Enthalpy Pump.
"U.S. Appl. No. 15/814,153, Non Final Office Action dated Oct. 9, 2019", 16 pgs.
"Chinese Application Serial No. 201680038135.4, Office Action dated Aug. 26, 2019", w/English Translation, 23 pgs.
"European Application Serial No. 16795581.4, Response filed Sep. 11, 2019 to Extended European Search Report dated Feb. 12, 2019", 14 pgs.
"European Application Serial No. 17762365.9, Extended European Search Report dated Oct. 17, 2019", 8 pgs.
"U.S. Appl. No. 15/574,205, Corrected Notice of Allowability dated Apr. 17, 2020", 2 pgs.
"U.S. Appl. No. 15/574,205, Notice of Allowance dated Apr. 9, 2020", 5 pgs.
"U.S. Appl. No. 15/574,205, Notice of Allowance dated Dec. 2, 2019", 5 pgs.
"U.S. Appl. No. 15/574,205, Response filed Nov. 18, 2019 to Non-Final Office Action dated Jun. 17, 2019", 8 pgs.
"U.S. Appl. No. 15/814,153, Response filed Apr. 9, 2020 to Non Final Office Action dated Oct. 9, 2019", 15 pgs.
"U.S. Appl. No. 16/083,280, Non Final Office Action dated Jan. 28, 2020", 6 pgs.
"Chinese Application Serial No. 201680038134.X, Office Action dated Apr. 7, 2020", w/o English Translation, 13 pgs.
"Chinese Application Serial No. 201680038134.X, Response filed Jan. 23, 2020 to Office Action dated Jul. 8, 2019", w/ English claims, 32 pgs.
"Chinese Application Serial No. 201680038135.4, Response filed Mar. 10, 2020 to First Office Action dated Aug. 26, 2019", w/ English Translation, 12 pgs.
"Chinese Application Serial No. 201780027034.1, Office Action dated Apr. 13, 2020", w/English Translation, 35 pgs.
"Chinese Application Serial No. 201680038134.X, Response filed Aug. 24, 2020 to Office Action dated Apr. 7, 2020", w/ English Translation, 24 pgs.
"U.S. Appl. No. 15/814,153, Non Final Office Action dated Jul. 6, 2020", 12 pgs.
"U.S. Appl. No. 16/083,280, Corrected Notice of Allowability dated Aug. 3, 2020", 2 pgs.
"U.S. Appl. No. 16/083,280, Notice of Allowance dated Jun. 12, 2020", 5 pgs.
"U.S. Appl. No. 16/083,280, Response filed May 28, 2020 to Non Final Office Action dated Jan. 28, 2020", 8 pgs.
"Australian Application Serial No. 2016265882, First Examination Report dated Aug. 5, 2020", 4 pgs.
"Chinese Application Serial No. 201680038134 X, Office Action dated Apr. 7, 2020", w/English Translation, 29 pgs.
"Chinese Application Serial No. 201680038135.4, Office Action dated Jun. 28, 2020", w/English Translation, 25 pgs.
"European Application Serial No. 17762365.9, Response filed May 15, 2020 to Extended European Search Report dated Oct. 17, 2019", 13 pgs.
"U.S. Appl. No. 16/083,280, Corrected Notice of Allowability dated Sep. 18, 2020", 2 pgs.
"Australian Application Serial No. 2016265883, First Examination Report dated Sep. 22, 2020", 4 pgs.
"Chinese Application Serial No. 201680038134.X, Response to Examiner Telephone Interview filed Oct. 20, 2020", w/ English Claims, 26 pgs.
"Chinese Application Serial No. 201680038135.4, Response filed Nov. 13, 2020 to Office Action dated Jun. 28, 2020", w/ current English claims, claims not amended in response filed, 8 pgs.
"Chinese Application Serial No. 201780027034.1, Response filed Oct. 28, 2020 to Office Action dated Apr. 13, 2020", w/ English claims, 46 pgs.
"Indian Application Serial No. 201717044890, First Examination Report dated Oct. 23, 2020", 6 pgs.
"Indian Application Serial No. 201717044889, First Examination Report dated Dec. 17, 2020", w/ English Translation, 6 pgs.
"Chinese Application Serial No. 201780027034.1, Response filed Oct. 28, 2020 to Office Action dated Apr. 13, 2020", w/English Translation, 39 pgs.
"U.S. Appl. No. 15/814,153, Corrected Notice of Allowability dated May 13, 2021", 3 pgs.
"U.S. Appl. No. 15/814,153, Notice of Allowance dated Apr. 8, 2021", 10 pgs.
"U.S. Appl. No. 15/814,153, Response filed Jan. 6, 2021 to Non Final Office Action dated Jul. 6, 2021", 12 pgs.
"Chinese Application Serial No. 201680038135.4, Office Action dated Apr. 8, 2021", w/English Machine Translation, 7 pgs.
"Chinese Application Serial No. 201780027034.1, Office Action dated Mar. 5, 2021", w/English Translation, 7 pgs.
"Indian Application Serial No. 201817037404, First Examination Report dated Feb. 19, 2021", 7 pgs.
"U.S. Appl. No. 15/814,153, Corrected Notice of Allowability dated May 27, 2021", 3 pgs.

* cited by examiner

USING LIQUID TO AIR MEMBRANE ENERGY EXCHANGER FOR LIQUID COOLING

CLAIM OF PRIORITY

This application is a U.S. National Stage Filing Under 35 U.S.C. § 371 of International Patent Application Serial No. PCT/CA2016/050252, filed on Mar. 8, 2016, and published on Nov. 24, 2016, as WO 2016/183667 A1, which claims the benefit of U.S. Provisional Patent Application Ser. No. 62/162,487, filed on May 15, 2015, the benefit of priority of which are claimed hereby, and which are incorporated by reference herein in their entirety.

BACKGROUND

There are many applications where cooling is critical, such as, for example, data centers. A data center usually consists of computers and associated components working continuously (24 hours per day, 7 days per week). The electrical components in a data center can produce a lot of heat, which then needs to be removed from the space. Air-conditioning systems in data centers can often consume more than 40% of the total energy.

With the current data centers' air-conditioning systems and techniques and significant improvements in IT components operating conditions and processing capacity, servers can roughly operate at 50% of their capacity. This capacity limitation is due, in part, to the cooling systems not being able to cool the servers efficiently and the servers reach their high temperature limit before reaching their maximum capacity. High density data center cooling seeks to cool servers more effectively and increase the density of the data centers. Consequently, this will result in savings in data center operating cost and will increase the data center overall capacity.

The high density data center cooling can be achieved by using liquid cooling technologies to reject the heat at the server. Data center liquid cooling affects the data center energy consumption in two ways: (1) utilizing maximum server processing capacity and data center processing density which will result in lower cooling power consumption per kW of processing power in the data center, and (2) generally liquid-cooling systems are more energy efficient than data centers air-cooling systems. The liquid cooling technology can capture up to 100% of the heat at the server which can eliminate the need for data centers air-cooling systems. The data center liquid cooling can save up to 90% in data centers cooling costs and up to 50% in data centers operating costs. Also, data center liquid cooling can increase the servers processing density by up to 100% which can result in significant savings in the data center white space.

High density cooling for data centers can include liquid cooling techniques which can use a special coolant and liquid circuit. The coolants can be expensive and as such, replacement of the coolant can also be expensive. The coolant can pick up the heat from the server and the heat can then be rejected to another liquid loop or cooling air stream. A cooling tower or outdoor dry cooler can be used to reject the heat from the coolant, but these may not be efficient. The water quality in cooling towers which should flow into a liquid circuit to pick up the heat from the coolant should be maintained at a certain level and could become a problem. The accumulation of dissolved minerals in the circulating cooling water can lead to deposits and scaling on the exchange surfaces which reduces performance. Corrosion of metal components and piping in cooling towers can be a common concern.

OVERVIEW

The present inventors recognize, among other things, an opportunity for improved performance in cooling an enclosed space, or a device, using a Liquid-to-Air Membrane Energy Exchanger (LAMEE) as an evaporative cooler and using the reduced-temperature water from the LAMEE to provide liquid cooling to the enclosed space or the device. In an example, the enclosed space can be a data center.

Examples according to the present application can include a liquid-cooling system which can reduce the data center cooling energy consumption by up to 95% compared to conventional air cooling data centers techniques. The liquid cooling system can be significantly smaller in size and lighter compared to other direct evaporative coolers (DEC), including air-cooling DECs. The liquid-cooling system as described herein can reduce the water consumption in comparison with other evaporative cooling systems and can reduce the operating cost of the data center by up to 60%.

Data centers liquid cooling can be much more efficient than data centers air cooling since a typical liquid, such as water, at the same volume flow rate as air, has almost 350 times higher thermal capacity than the air. As such, the required water flow rate to reject a certain amount of heat from an IT component can be almost 350 times lower than the required air flow rate. Liquid (mainly water) can be cooled in a liquid to air membrane energy exchanger (LAMEE), also referred to herein as an exchanger. The LAMEE or exchanger can cool both outdoor (scavenger) air and liquid water, under some scavenger air conditions, to the outdoor air wet-bulb temperature. The reduced temperature water output from the LAMEE can be supplied to an enclosed space, such as, for example, a data center having IT components. The reduced temperature water can be stored in a tank prior to providing liquid cooling.

Examples according to the present application can include using a LAMEE in evaporative cooling and data centers liquid cooling applications, using water in a membrane exchanger for evaporative cooling and data centers cooling, and using a liquid pre-cooler downstream of an evaporative LAMEE to increase the system efficiency and operate the system on economizer mode. Various system configurations can be used and can include, but are not limited to, a liquid cooling coil upstream or downstream of the LAMEE for high efficiency cooling applications. Examples according to the present application can include integrating the LAMEE with current liquid cooling technologies available in the market such as liquid cooling immersing technology and using cold plates at the server to reject heat.

Examples according to the present application can include integration of a liquid cooling coil downstream of the LAMEE which can cool the hot water before entering the LAMEE and can boost the system performance. Also, the liquid cooling coil can work as an economizer for the cooling system. Whenever the outdoor air is cold enough to cool the water to the set point temperature, water can bypass the exchanger and only pass though the cooling coil. The economizer mode can expand the life of the LAMEE and can save water since no water evaporates in the system on economizer mode.

Examples according to the present application can include a conditioning system for controlling conditions in an enclosed space. The conditioning system can include a cooling system disposed outside of the enclosed space and having a scavenger air plenum configured to direct scavenger air in a flow path from an air inlet to an air outlet. A LAMEE can be arranged inside the plenum and can comprise a cooling fluid flow path separate from an air flow path by a membrane. The LAMEE can be configured to use the scavenger air to evaporatively cool a cooling fluid in the cooling fluid flow path and lower a temperature of the cooling fluid in the LAMEE. The conditioning system can include a cooling fluid circuit connected to the cooling fluid flow path of the LAMEE and extending from the plenum into the enclosed space. The cooling fluid circuit can be used to deliver reduced temperature water from the LAMEE or a reduced temperature coolant to the enclosed space to provide cooling to the enclosed space without moving air from the enclosed space through the cooling system.

Examples according to the present application can include a conditioning system for controlling conditions in an enclosed space having a first cooling system disposed outside of the enclosed space and a second cooling system disposed inside the enclosed space. The first cooling system can include a scavenger air plenum configured to direct scavenger air in an air flow path from an air inlet to an air outlet and a LAMEE arranged inside the plenum. The LAMEE can include a water flow path separated from the air flow path by a membrane. The LAMEE can be configured to use the scavenger air to reduce a temperature of water in the water flow path. The conditioning system can include a cooling fluid circuit connected to the water flow path of the LAMEE and to the second cooling system. The cooling fluid circuit can provide cooling to the enclosed space without moving air from the enclosed space through the first cooling system. The second cooling system can include direct cooling, using water or a coolant in the cooling fluid circuit, to one or more components in the enclosed space. The one or more components can include, but are not limited to, electrical components. The second cooling system can include sensible cooling of air in the enclosed space using water or a coolant in the cooling fluid circuit.

Examples according to the present application can include a conditioning system for controlling conditions in an enclosed space having a cooling system disposed outside of the enclosed space. The cooling system can comprise a scavenger air plenum configured to direct scavenger air in an air flow path from an air inlet to an air outlet and a LAMEE arranged inside the plenum in the air flow path. The LAMEE can comprise a cooling fluid flow path separated from the air flow path by a membrane. The LAMEE can be configured to use the scavenger air to evaporatively cool a cooling fluid in the cooling fluid flow path such that a temperature of the cooling fluid at a fluid outlet of the LAMEE is lower than a temperature of the cooling fluid at a fluid inlet of the LAMEE. The cooling system can further comprise a first cooling unit arranged inside the plenum between the air inlet and the LAMEE and configured to condition the scavenger air prior to the scavenger air entering the LAMEE. The cooling system can further comprise a second cooling unit arranged inside the plenum between the LAMEE and the air outlet and configured to reduce a temperature of the cooling fluid before the cooling fluid enters the LAMEE at the fluid inlet. The cooling system can further comprise one or more bypass dampers configured to permit scavenger air to enter or exit the air flow path at one or more locations between the air inlet and outlet. A cooling fluid circuit of the conditioning system can be connected to the cooling fluid flow path of the LAMEE and extend from the plenum into the enclosed space. The cooling fluid circuit can provide cooling to the enclosed space without moving air from the enclosed space through the cooling system.

Examples according to the present application can include a conditioning system for providing cooling to a device that can be located either in an enclosed space or at a location open to the atmosphere. The conditioning system can include the device to be cooled, in combination with a cooling system that is separate from and remote to the device to be cooled. The cooling system can include a LAMEE for providing reduced-temperature water, and the reduced temperature water, or a coolant cooled by the reduced-temperature water, can be delivered to the device. The reduced temperature water or coolant can be used to provide cooling to the device and the water or coolant can be recirculated back to the cooling system. The device can be any type of equipment or component that generates heat or uses a liquid to reject heat.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to systems and methods for controlling conditions inside an enclosed space, or providing cooling to a device, using a Liquid-to-Air Membrane Energy Exchanger (LAMEE) as an evaporative cooler for liquid-cooling. The LAMEE or exchanger can cool water or both outdoor (scavenger) air and water to the outdoor air wet bulb temperature, depending in part on the air conditions. The reduced temperature water from the exchanger can provide cooling to the enclosed space or to the device. In an example, a cooling coil can be included after the exchanger to cool the hot return water from the enclosed space or the device, before the water is recycled to the exchanger. The cooling coil can use the cold scavenger air exhausting from the exchanger to cool the return water. The cooling coil can boost the performance of the system and can provide an economizer operating mode. In winter when the outdoor air is cold, the scavenger air can bypass the exchanger and pass directly through the cooling coil. The economizer mode can bring more energy and water savings to the liquid-cooling system. In an example, a cooling coil can be included before the exchanger to cool the scavenger air prior to passing the scavenger air through the exchanger. The reduced temperature water from the exchanger can be delivered to the enclosed space or the device to provide direct cooling to the enclosed space or the device. Alternatively, the reduced temperature water can provide cooling to a coolant in a liquid to liquid heat exchanger (LLHX) and the reduced temperature coolant can be delivered to the enclosed space or the device.

As described herein, a dry coil or cooling coil can be used upstream of the LAMEE or downstream of the LAMEE, or both. In some examples, the cooling coil can be referred to herein as a pre-cooling coil or a pre-cooler if it is located upstream of the LAMEE. The pre-cooler can be used to cool the scavenger air before the scavenger air enters the LAMEE. In some examples, the cooling coil can be referred to herein as an economizer coil if it can be configured for cooling the water in an economizer mode in which the LAMEE is bypassed and the cooling coil provides cooling to the return water. It is recognized that, in some examples, the cooling coils described herein can be the same type of cooling coil and have the same general design, regardless of whether the cooling coil is upstream or downstream of the LAMEE, or described as a pre-cooler, an economizer coil or a dry coil. As described further below, in some examples a cooling coil can function in some modes (for example, in summer) as a pre-cooler to the scavenger air and in other modes (for example, in winter) that same cooling coil can switch its function to be for cooling the increased-temperature water returning to the system.

Figure 1:
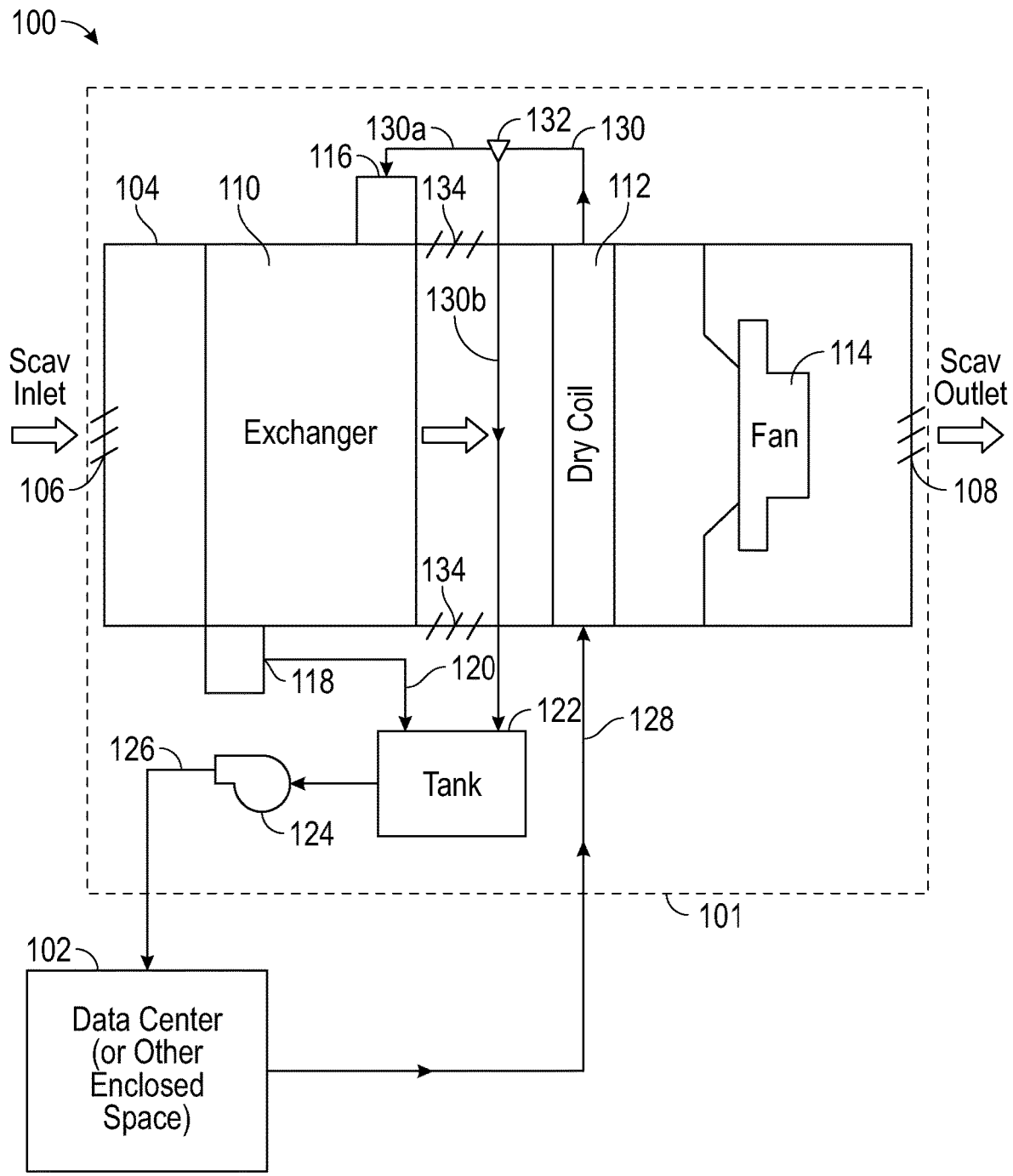
FIG. 1 is a schematic of an example conditioning system for controlling conditions in an enclosed space, in accordance with the present patent application.

FIG. 1 depicts an example conditioning system 100 for providing cooling to a data center (or other enclosed space) 102. The conditioning system 100 can include a scavenger air plenum 104 which can include an air inlet 106 and an air outlet 108 through which a scavenger air stream can flow. The plenum 104 can also be referred to as a housing, cabinet or structure, and can be configured to house one or more components used to condition air or water. The plenum 104 can be disposed outside of the data center 102. The conditioning system 100 can include a liquid-to-air membrane energy exchanger (LAMEE) 110, a dry coil (or cooling coil) 112, and a fan 114. The LAMEE 110 can also be referred to herein as the exchanger 110.

A liquid to air membrane energy exchanger (LAMEE) can be used as part of a heating and cooling system (or energy exchange system) to transfer heat and moisture between a liquid desiccant and an air stream to condition the temperature and humidity of the air flowing through the LAMEE. In an example, the membrane in the LAMEE can be a non-porous film having selective permeability for water, but not for other constituents that form the liquid desiccant. Many different types of liquid desiccants can be used in combination with the non-porous membrane, including, for example, glycols. The non-porous membrane can make it feasible to use desiccants, such as glycols, that had been previously determined to be unacceptable or undesirable in these types of applications. In an example, the membrane in the LAMEE can be semi-permeable or vapor permeable, and generally anything in a gas phase can pass through the membrane and generally anything in a liquid phase cannot pass through the membrane. In an example, the membrane in the LAMEE can be micro-porous such that one or more gases can pass through the membrane. In an example, the membrane can be a selectively-permeable membrane such that some constituents, but not others, can pass through the membrane. It is recognized that the LAMEEs included in the conditioning systems disclosed herein can use any type of membrane suitable for use with an evaporative cooler LAMEE.

The LAMEE or exchanger 110 in the conditioning system 100 (as well as the other exchangers disclosed in the examples of FIGS. 2-7) can circulate a cooling fluid, which can be an evaporative fluid, through the LAMEE or exchanger 110 to reduce a temperature of the cooling fluid. The LAMEE or exchanger 110 can operate as an evaporative cooler, using the cooling potential in both air and the cooling fluid (for example, water) to reject heat. In an example, the LAMEE or exchanger 110 can use a flexible polymer membrane, which is vapor permeable, to separate air and water. The water flow rate through the LAMEE 110 may not be limited, compared to other conditioning systems, and the LAMEE 110 can operate with water entering the LAMEE 110 at higher temperatures.

The cooling fluid circulating through the LAMEE or exchanger 110 can include water, liquid desiccant, glycol, other hygroscopic fluids, other evaporative liquids, and/or combinations thereof. In an example, the cooling fluid is a liquid desiccant that is a low concentration salt solution. The presence of salt can sanitize the cooling fluid to prevent microbial growth. In addition, the desiccant salt can affect the vapor pressure of the solution and allow the cooling fluid to either release or absorb moisture from the air. The concentration of the liquid desiccant can be adjusted for control purposes to control the amount of cooling of the scavenger air or cooling fluid within the LAMEE or exchanger 110.

In an example, the cooling fluid in the LAMEE or exchanger 110 can be water or predominantly water. In the conditioning system 100 of FIG. 1, as well as the conditioning systems of FIGS. 2-7, the cooling fluid is described as being water and the LAMEE or exchanger 110 can include a water inlet 116 and a water outlet 118 for passing water through the exchanger 110. The inlet 116 and outlet 118 can be described as a cooling fluid inlet and a cooling fluid outlet since a fluid in addition to, or as an alternative to, water can circulate through the exchanger 110. It is recognized that other types of evaporative cooling fluids, including those listed above, can be used in combination with water or as an alternative to water in the conditioning systems of FIGS. 1-7.

The LAMEE or exchanger 110 can be referred to herein as an evaporative cooler and/or an evaporative cooler LAMEE. As scavenger air flows through the exchanger 110, the water, or both the scavenger air and the water, can be cooled to the outside air wet bulb (WB) temperature. The scavenger air exiting the exchanger 110 can pass through the dry coil 112 and the fan 114 and exit the plenum 104 at outlet 108 as exhaust. The dry coil 112 is discussed further below.

Due to the evaporative cooling process in the exchanger 110, a temperature of the water at the outlet 118 of the exchanger 110 can be less than a temperature of the water at the inlet 116. The reduced-temperature water from the exchanger 110 can be used to provide cooling to the data center 102. The exchanger 110 and other components inside the plenum 104, such as the dry coil 112, can be referred to herein as a cooling system 101. The cooling system 101 can be located or disposed outside of the data center 102.

After exiting the exchanger 110, the reduced-temperature water can flow via a water line 120 into a water tank 122. Although not shown in FIG. 1, the water tank 122 can include a make-up valve and a drain valve to maintain the water level and hardness level inside the tank 122. The water tank 122 can include one or more temperature sensors in or around the water tank 122 to monitor a temperature of the water in the tank 122. In an example, a control of the conditioning system 100 can be based, in part, on a measured temperature of the water in the tank 122 compared to a setpoint water temperature. In an example, the setpoint water temperature can be pre-determined based on an estimated cooling load of the data center 102. In an example, the setpoint water temperature can vary during operation of the conditioning system 100, based in part on operation of the data center 102.

The water from the water tank 122 can be pumped with a pump 124 to the data center 102 via a water line 126. As described further below, the reduced-temperature water can provide cooling to the data center 102 by transporting the water to the data center 102, eliminating the steps of moving hot supply air from the data center 102 through the cooling system 101 and then back to the data center 102. The reduced-temperature water can cool the data center 102 using any known methods to reject heat from the data center 102, including but not limited to, liquid immersing technology, cold plate technology, rear door heat exchangers, cooling distribution units (CDU), and cooling coils. In an example, the water can directly cool one or more components in the data center 102. The one or more components can include, but are not limited to, electrical components. In an example, the water can pass through one or more cooling coils placed in a path of the supply air in the data center 102, and the water in the cooling coil can sensibly cool the supply air. See FIGS. 8-10 which are described below.

After the water provides cooling to the data center 102, the water can be recirculated back to the exchanger 110. The water can be at an increased-temperature when it exits the data center 102 because the rejected heat from the data center 102 has been picked up by the water. The water can pass from the data center 102 to the dry coil 112 through a water line 128, and the dry coil 112 can cool the water before the water is returned to the exchanger 110. The dry coil 112 can cool the water using the cooling potential of the scavenger air. The scavenger air exiting the exchanger 110 can be relatively cool and additional sensible heat from the water can be rejected into the scavenger air. In other examples, the water can pass directly back to the exchanger 110 rather than first passing through the dry coil 112.

The water can exit the dry coil 112 through a water line 130, which can be split, using a bypass valve 132, into a water line 130a to the exchanger 110 and a water line 130b to the tank 122. The bypass valve 132 can control how much of the water exiting the dry coil 112 is sent to the exchanger 110 and how much is sent to the tank 122.

In an economizer mode, the bypass valve 132 can be open such that all of the water from the dry coil 112 can bypass the exchanger 110 and go directly to the tank 122. The economizer mode or winter mode can enable the cooling system 101 to cool the water using the scavenger air and dry coil 112, without having to run the exchanger 110. In that situation, there may be no need for evaporation inside the exchanger 110 since the cold outdoor air (scavenger air) can pass through the dry coil 112 and cool the water. The dry coil 112 can also be referred to herein as an economizer coil since it can be a primary cooling source for the water in the economizer mode.

The plenum 104 can include one or more bypass dampers 134 between the exchanger 110 and the dry coil 112. In the economizer mode, the scavenger air can also bypass the exchanger 110 by entering the plenum 104, through the bypass dampers 134, downstream of the exchanger 110. This can protect the exchanger 110 and avoid running the exchanger 110 when it is not needed. The cooling system 101 can modulate between a normal mode and an economizer mode to limit power consumption and based on outdoor air conditions.

The reduced-temperature water from the exchanger 110 can be part of a cooling fluid circuit that can extend from the plenum 104 and be delivered to the data center 102. After the water provides cooling to the data center 102, the water can be recirculated through the cooling system 101. The water tank 122 and the pump 124 can be considered to be part of the cooling fluid circuit or the cooling system 101. One or both of the tank 122 and pump 124 can be located physically in the plenum 104, or one or both of the tank 122 and pump 124 can be physically located in the data center 102. Alternatively, one or both of the tank 122 and pump 124 can be located in a structure separate from the plenum 104 or the data center 102.

Using a LAMEE in the cooling system 101 can offer advantages over conventional cooling systems, such as cooling towers, for example. The membrane separation layer in the LAMEE can reduce maintenance, can eliminate the requirement for chemical treatments, and can reduce the potential for contaminant transfer to the liquid loop. The use of LAMEEs along with an upstream or downstream cooling coil can result in a lower temperature of the water leaving the LAMEE and a higher cooling potential. Various configurations of cooling systems having a LAMEE are described herein and can boost performance in many climates. Higher cooling potential and performance can result in lower air flow and fan power consumption in the cooling system, which is the main source of energy consumption in liquid-cooling systems, and can increase the overall data center cooling system efficiency.

The cooling system 101 can maximize the cooling potential in the exchanger 110 and modulate the scavenger air through the plenum 104 based on the outdoor air conditions. The economizer mode, for example, in winter, can provide a reduction in water usage and power consumption compared to conventional cooling systems. The cooling system 101 can be smaller in size relative to conventional cooling systems, such as a cooling tower having a similar cooling capacity. The cooling system 101 can require less water treatment and water filtration compared to conventional cooling systems since the water and the scavenger air in the exchanger 110 do not come into direct contact with each other.

The cooling system 101 can utilize reduced-temperature water to provide cooling to a data center or other enclosed space. The reduced-temperature water can be transported from the cooling system 101, which is disposed outside of the data center 102, to the data center 102 or other enclosed space. In contrast, for existing air cooling designs, process air from the data center can be delivered to the cooling system which can be configured as a larger unit for two air flow paths—the process air and the scavenger air. Thus more energy is used in those designs to move the process air from the data center to the cooling system and then condition the process air. In the systems described herein, less energy by comparison can be used to deliver the reduced-temperature water from the cooling system to the data center. Moreover, water has a higher thermal capacity than air; thus a lower flow rate of water can be used, compared to air, to reject a certain amount of heat directly from one or more electrical components in the data center (or other components needing cooling) or from the air in the data center.

The term "provide cooling to the enclosed space" as used herein refers to using the reduced-temperature water from the LAMEE or exchanger to cool the air in the enclosed space or to cool one or more components in the enclosed space. The components within the space can be directly cooled (see FIGS. 8 and 9) with the reduced-temperature water or a coolant, the air around the components can be cooled (see FIG. 10), or a combination can be used. Although the present application focuses on a data center as the enclosed space, the systems and methods disclosed herein for cooling can be used in other examples of enclosed spaces, including for example, a telecommunication room, industrial applications and commercial spaces. The systems and methods disclosed herein can be used in any application using water for cooling and then a cooling tower, or any application using dry coolers in combination with a supplemental heat rejection system for high scavenger air dry bulb temperatures.

FIGS. 2-7 illustrate various configurations of conditioning systems that can have alternative or additional components, compared to the conditioning system 100 of FIG. 1, in combination with a LAMEE. A particular configuration can be selected based in part on the cooling load of the enclosed space and a pre-determined temperature of the water (or coolant) to be delivered to the enclosed space to meet the cooling load. For example, in an application requiring that very cold water or coolant be provided to the enclosed space to meet the cooling load, a pre-cooler can be included in the conditioning system. In other examples in which it may be sufficient to provide a higher-temperature water or coolant (relative to the application described immediately above) to the enclosed space, the pre-cooler may not be needed to meet the cooling load of the enclosed space.

A control system for the conditioning systems is described further below in reference to the system 500 of FIG. 5. It is recognized that a similar control system could be used for the other conditioning systems described herein and shown in FIGS. 1-4 and 6-7. A goal of the conditioning systems is to provide sufficient cooling to the data center or other enclosed space using less water and less energy. The use of a LAMEE as an evaporative cooler to produce cold water outside of the enclosed space and delivering the cold water (or coolant) to the enclosed space can provide water savings, as compared to other liquid cooling technologies, and energy savings, as compared to other existing air cooling technologies.

Figure 2:
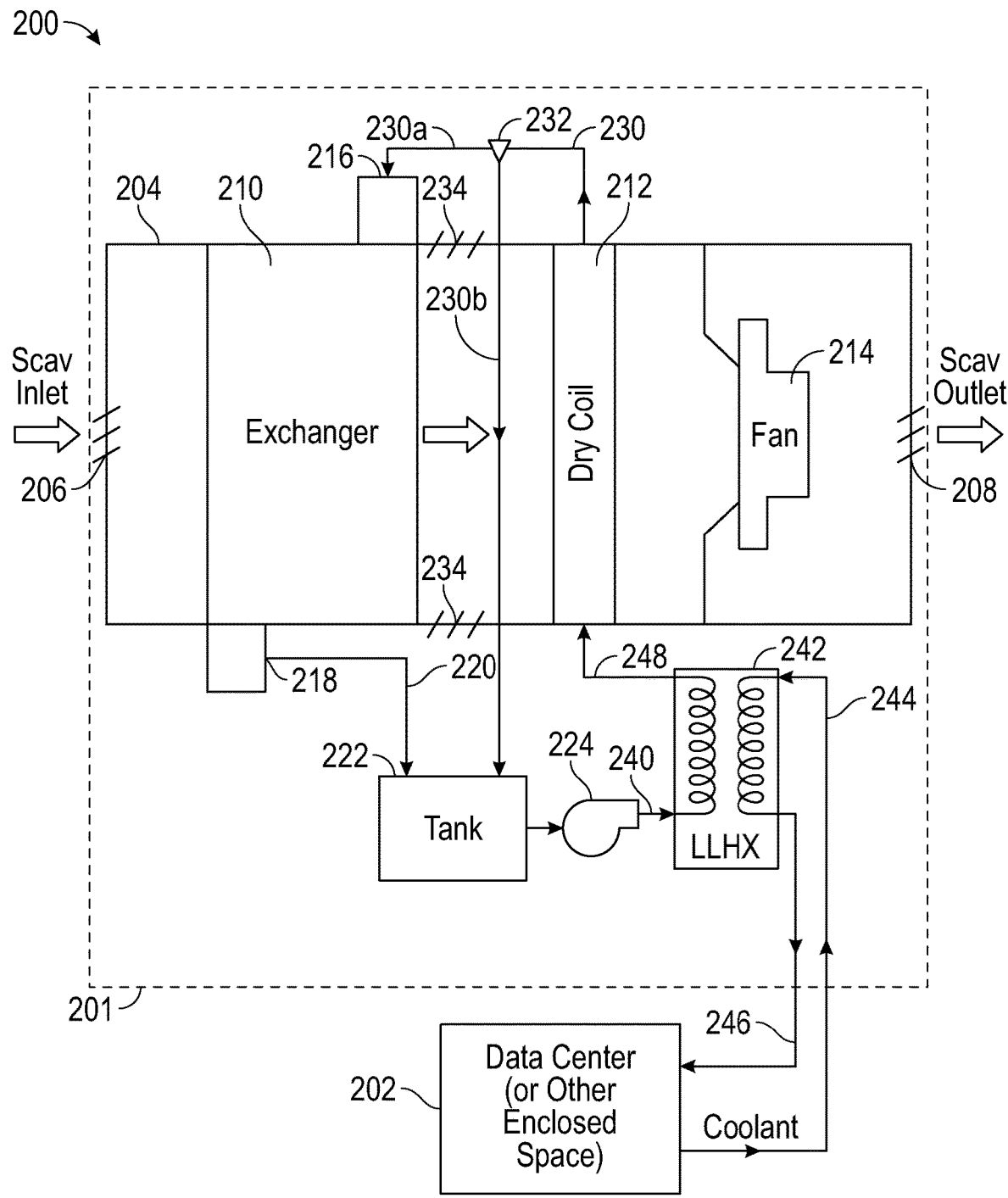
FIG. 2 is a schematic of an example conditioning system in accordance with the present patent application.

FIG. 2 depicts an example conditioning system 200 that can be similar to the system 100 of FIG. 1. The system 200 can include an exchanger 210 and a cooling unit or dry coil 212 located in a scavenger air plenum 204, which together can form a cooling system 201. The cooling system 201 can operate in a normal mode or an economizer mode, as described above in reference to the cooling system 101, to provide cooling to a data center 202. Instead of delivering water from a tank 222 to the data center 202, the water can be pumped, using a pump 224, through a water line 240 to a liquid to liquid heat exchanger (LLHX) 242.

A coolant can enter the LLHX 242 through an input line 244 and exit the LLHX 242 through an output line 246. The coolant can be any suitable coolant used to provide direct cooling to one or more components in the data center 202 or to provide sensible cooling to supply air or data center air in the data center 202. In an example, the coolant can include anti-freeze to minimize the risk of the coolant freezing in the winter.

The lines 244 and 246 can be fluidly connected to the data center 202 such that the coolant exiting the LLHX 242 in the line 246 can be delivered to the data center 202. After providing cooling to the data center 202, the higher-temperature coolant can be recirculated back through the LLHX 242 via the line 244. The reduced-temperature water from the tank 222 can cool the higher-temperature coolant in the LLHX 242 such that the coolant can exit the LLHX 242 at a lower temperature and be returned to the data center 202. The higher-temperature water exiting the LLHX 242 can be delivered to the dry coil 212 through a water line 248. The water can be cooled in the dry coil 212 and returned to the exchanger 210 or the tank 222 as described above in reference to the system 201 of FIG. 1.

In the conditioning system 200, the reduced-temperature water from the exchanger 210 can cool the coolant and the coolant can provide cooling to the data center 202. This secondary coolant loop through the LLHX 242 can protect the components in the data center 202 from deposition caused by water hardness. The selected coolant can have anti-corrosion additives to protect metal components from corrosion. A selection between a cooling system using water to provide direct cooling to the data center (FIG. 1) and a cooling system having a secondary cooling loop (FIG. 2) can depend, in part, on the requirements of the data center (or other enclosed space), the type of equipment in the data center, and the type of cooling system used within the data center 202. A variety of methods can be used to reject heat from the data center 202 using either water or a coolant. This is described further below in reference to FIGS. 8-10.

The LLHX 242 can be located physically in the plenum 204 or the LLHX 242 can be located in the data center 202. If the LLHX 242 is located in the data center 202 and the tank 222 is located outside the data center 202, the pump 224 can pump the water through the line 240 to the data center 202. Alternatively, the LLHX 242 can be in a structure separate from the plenum 204 or the data center 202, and in that case, the tank 222 can be located in the same or a different location from the LLHX 242.

Figure 3:
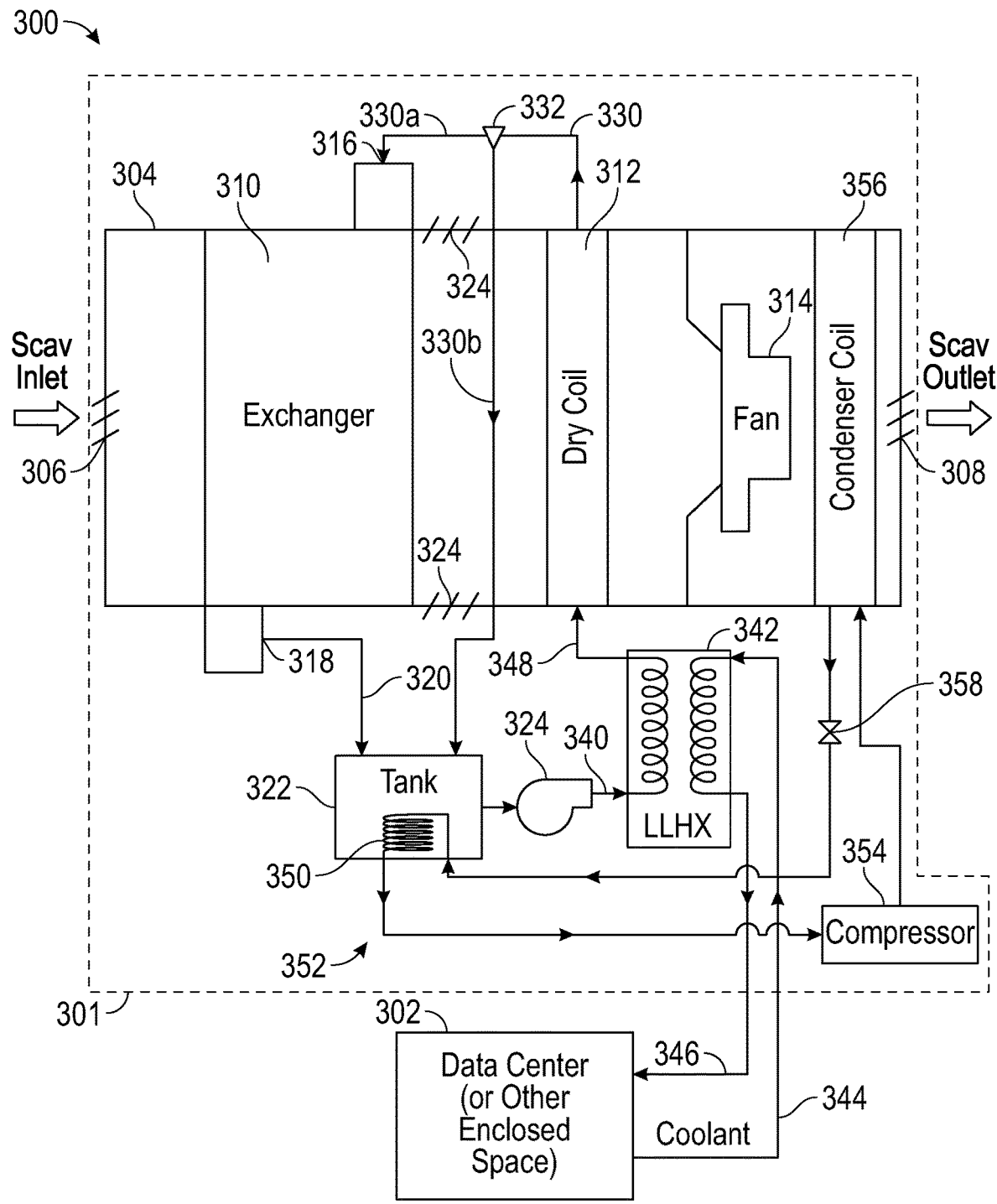
FIG. 3 is a schematic of an example conditioning system in accordance with the present patent application.

FIG. 3 depicts an example conditioning system 300 having a cooling system 301 for providing cooling to a data center (or other enclosed space) 302. The cooling system 301 can be similar to the system 201 of FIG. 2 and can include a secondary coolant loop having an LLHX 342. The system 300 can additionally include a direct expansion (DX) cooling coil 350 in a water tank 322.

The DX coil 350 can be used to provide additional cooling to the water in the tank 322 such that lower-temperature water can be provided to the LLHX 342. In an example, the DX coil 350 can be used to pre-cool water in the tank 322 before or during start-up of the cooling system 301. A refrigerant loop 352 can be included in the cooling system 301 to cool the refrigerant exiting the DX coil 350. The refrigerant loop 352 can include a compressor 354, a condenser coil 356, and an expansion valve 358. The condenser coil 356 can be located inside the scavenger air plenum 304. Scavenger air passing through the condenser coil 356 can cool the refrigerant. The cooled refrigerant can then be recirculated back through the DX coil 350 in the tank 322.

As shown in FIG. 3, the scavenger air passes through the fan 314 and then the condenser coil 356. In other examples, the order of the fan 314 and the condenser coil 356 in the plenum 304 can be reversed.

It is recognized that a DX coil can be used in the water tank of any of the other cooling systems described herein, including the cooling systems of FIGS. 1 and 4-7. Other types of mechanical cooling means can be used in addition to, or as an alternative to, the DX coil 350 to cool the water in the tank 322 and such cooling means can be located inside or outside of the tank 322. For example, a liquid to refrigerant heat exchanger, located outside of the tank 322, can use a refrigerant to cool the water from the tank 322 before the water is directed to the LLHX 342. In that case, the increased-temperature refrigerant can pass through the compressor 354, condenser coil 356 and expansion valve 358, as shown in FIG. 3. In an example, a chilled water coil can be used in the water tank and the chilled water can be provided using a chiller, in which case a compressor, condenser coil and expansion valve for a refrigerant would not be needed. If the data center 302 or enclosed space has a chiller on site, this can be an effective option for providing additional cooling to the water in the tank 322.

In an example, a thermal storage tank can be used in the cooling system 301 (or any of the conditioning systems described herein) in combination with the tank 322. The thermal storage tank can provide a stand-by cooling option for the water from the tank 322, for example, during a shut-down of the system 301. The water from the tank 322 can be drained into the thermal storage tank.

Figure 4:
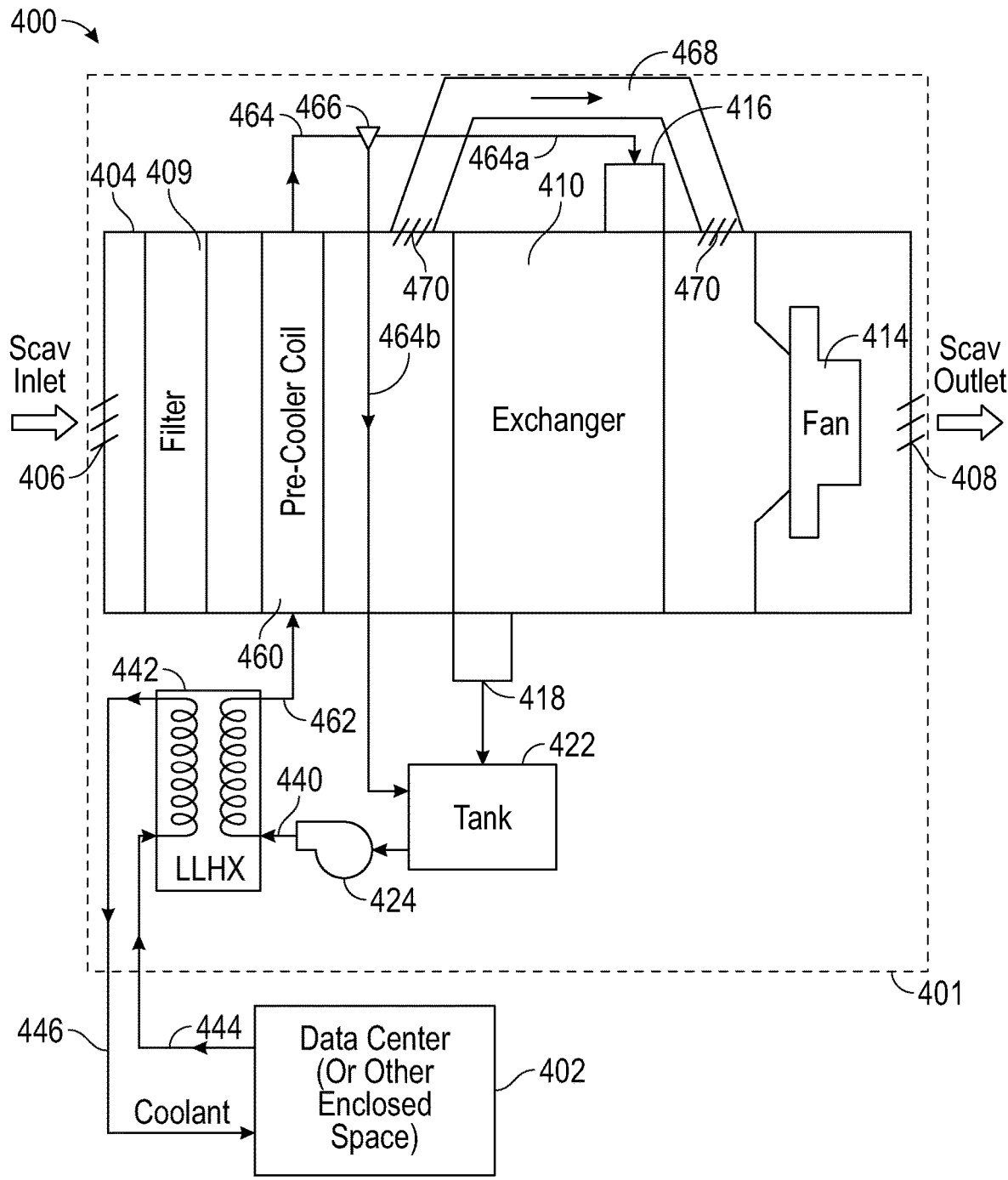
FIG. 4 is a schematic of an example conditioning system in accordance with the present patent application.

FIG. 4 depicts an example conditioning system 400 having a cooling system 401 for providing cooling to a data center (or other enclosed space) 402. The cooling system 401 can be similar to the system 201 of FIG. 2 and can include an exchanger 410 and a secondary coolant loop having an LLHX 442. Instead of having a dry coil located downstream of the exchanger 410 (see the dry coil 212 of FIG. 2), the cooling system 401 can include a dry coil or pre-cooler coil 460 (also referred to as a pre-cooling coil or a pre-cooler) upstream of the exchanger 410. A filter 409 can be arranged inside the plenum 404 near an air inlet 406. It is recognized that a filter can similarly be included in the plenum of the other conditioning systems of FIGS. 1-3, 5 and 6.

In the design shown in FIG. 4, an input line 462 to the pre-cooler 460 can carry the water from the LLHX 442. The pre-cooler 460 can be effective when the temperature of the water entering the pre-cooler 460 is lower than the outdoor air dry bulb temperature. The cooling system 401 can be used in typical summer conditions as well as extreme summer conditions when the outdoor air can be very hot and humid. The pre-cooler 460 can depress the outdoor air dry bulb temperature, thus pre-cooling the scavenger air passing through the pre-cooler 460 and heating the water in the pre-cooler 460. The scavenger air and the water can then pass through the exchanger 410 as described above, in which case evaporation occurs and water or both the air and water can be cooled to the outdoor air wet bulb temperature. This can be referred to as a summer mode or a normal operating mode when the scavenger air and water are passing through the pre-cooler 460 and the exchanger 410.

If the outdoor air is cold, such as in winter, the cooling system 401 can operate in an economizer mode or winter mode as similarly described above in reference to FIG. 1. Because the scavenger air is cold, the scavenger air can cool the water as the scavenger air passes through the pre-cooler 460. In that case, the pre-cooler 460 is not providing cooling to the scavenger air as described above, but rather the pre-cooler 460 can use the cold scavenger air to cool the water from the line 462 such that the water can exit the pre-cooler 460 at a reduced temperature and be recirculated back to the tank 422, without having to be cooled in the exchanger 410.

The water can exit the pre-cooler 460 through a water line 464 that can be split, as described above in reference to FIG. 1, using a valve 466. The valve 466 can control the flow of water to the exchanger 410, through line 464a, and to the tank 422, through line 464b. During the economizer mode, all or a majority of the water in the line 464 can be sent to the tank 422 since the water can be cooled in the pre-cooler 460 and the exchanger 410 may not be needed. During warm outdoor air conditions, all or a majority of the water in the line 464 can be sent to the exchanger 410 since the pre-cooler 460 in that situation is functioning as a cooling coil for the scavenger air.

The plenum 404 can include an air bypass 468 having dampers 470. The bypass 468 can allow the scavenger air to bypass the exchanger 410 in an economizer mode when the exchanger 410 is not being used. The scavenger air can then pass through the fan 414 and then exit at the scavenger air outlet 408 as exhaust air. Alternatively, dampers similar to dampers 134 shown in FIG. 1 can be used such that the scavenger air can exit the plenum 404 at a location between the pre-cooler 460 and the exchanger 410.

In both summer and winter modes, the scavenger air can modulate to control power consumption. The scavenger air flow rate can depend, in part, on the outdoor air conditions and the location where the plenum 404 is installed.

In other examples, the cooling system 401 can exclude the LLHX 442 and water from the tank 422 can be delivered directly to the data center 402 as described in reference to the cooling system 101 of FIG. 1.

In other examples, the cooling system 401 can include a DX coil inside the tank 422, as well as the other components of the refrigerant loop for the DX coil (see FIG. 3). A cooling system having the pre-cooler 460, as shown in FIG. 4, in combination with a DX coil inside the tank 422 can be used in extreme outdoor air conditions. If the temperature in the tank 422 is higher than the setpoint temperature (to cover 100% of the load), a DX coil in the tank 422 can cool the water in the tank 422 to the setpoint temperature. Thus the DX coil can provide additional cooling of the water leaving the tank 422 so that the water 422 can be sufficiently cool to cover the load for the data center 402. During other outdoor air conditions, a DX coil in the tank 422 may not be needed to cover the load. In winter or during an economizer mode, such a cooling system (the cooling system 401 with a DX coil inside the tank 422) can have an air bypass similar to the air bypass 468 shown in FIG. 4 and such bypass may extend past the condenser for the refrigerant loop so that the scavenger air can bypass the exchanger and the condenser, pass through the fan and exit the plenum. Alternatively, as described above, bypass dampers can be used to direct the scavenger air out of the plenum at a location between the pre-cooler 460 and the exchanger 410.

Figure 5:
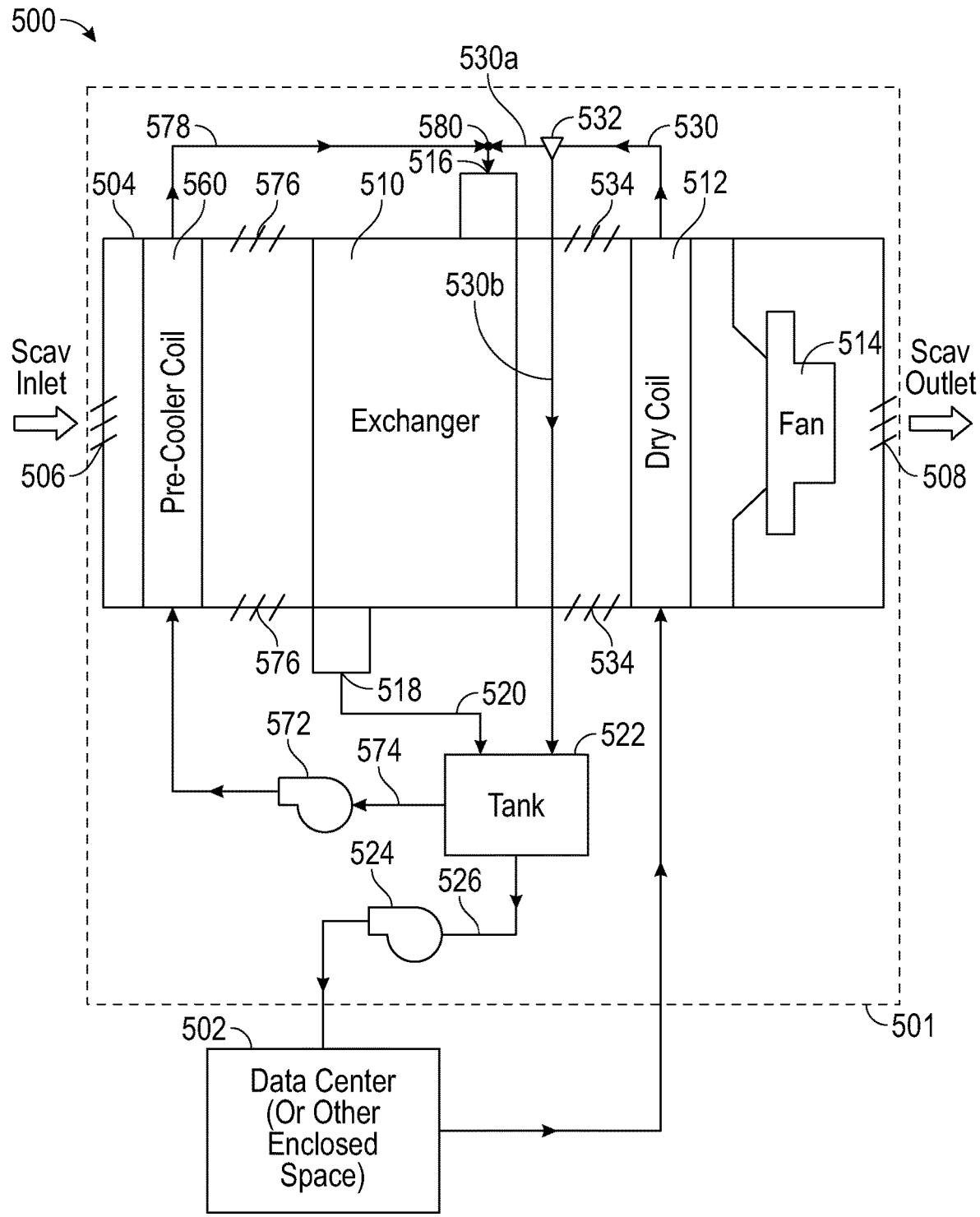
FIG. 5 is a schematic of an example conditioning system in accordance with the present patent application.

FIG. 5 depicts an example conditioning system 500 having a cooling system 501, which is similar to the cooling system 101 of FIG. 1, for providing cooling to a data center 502 or other enclosed space. The cooling system 501 can also include a pre-cooler or dry coil 560 (also referred to as a pre-cooling coil or a pre-cooler coil) inside the plenum 504 such that the system 501 includes a first cooling unit (pre-cooler 560) upstream of an exchanger 510 and a second cooling unit (dry coil 512) downstream of the exchanger 510. The dry coil 512 can be similar to the dry coils 112, 212 and 312 of FIGS. 1, 2 and 3, respectively. The pre-cooler 560 can be similar to the pre-cooler 460 of FIG. 4.

As described above in reference to other cooling system examples, the dry coil 512 can effectively cool the higher-temperature water using the relatively cool scavenger air exiting the exchanger 510. The pre-cooler 560 can be used in humid or extreme outdoor air conditions to condition the scavenger air prior to passing the scavenger air through the exchanger 510. The pre-cooler 560 can depress the outdoor air wet bulb temperature to provide more cooling potential in the exchanger 510.

A flow path of the reduced-temperature water from the exchanger 510 and the dry coil 512 to the tank 522 can be similar to the description above in reference to FIG. 1. A flow path of the increased-temperature water from the data center 502 to the dry coil 512 can be similar to the description above in reference to FIG. 1. The reduced-temperature water can leave the tank 522 through two different water lines. A first pump 524 can pump water from the tank 122 to the data center 502 through a water line 526. A second pump 572 can pump water from the tank 122 to the pre-cooler 560 through a water line 574. In other examples, one water line and one pump can be used to deliver water out of the tank 522 and a split valve can be used to control the delivery of water to the data center 502 and to the pre-cooler 560. (See FIG. 6.)

The plenum 504 can include two sets of bypass dampers—first dampers 576 between the pre-cooler 560 and the exchanger 510, and second dampers 534 between the exchanger 510 and the dry coil 512. The use of the bypass dampers 576 and 534 to direct the flow of scavenger air into the plenum 504 can depend on the outdoor air conditions. Although the first and second bypass dampers 576 and 534 are each shown as having a pair of dampers on opposing sides of the plenum 504, it is recognized that one or both of the first 576 and second 534 bypass dampers can be a single damper on one side of the plenum 504.

The cooling system 501 can operate in three modes and selection of the mode can depend, in part, on the outdoor air conditions and a cooling load of the data center 502. When the outdoor air is cold, the cooling system 501 can operate in a first mode, an economizer mode, and the pre-cooler 560 and the exchanger 510 can be bypassed. The scavenger air can enter the plenum 504 through dampers 534 and pass through the dry coil 512. In a second operating mode, which can also be referred to as a normal mode or an evaporation mode, the pre-cooler 560 can be bypassed. The evaporation mode can operate during mild conditions, such as spring or fall when the temperature or humidity is moderate, as well as some summer conditions. The scavenger air may be able to bypass the pre-cooler 560, while still meeting the cooling load. The scavenger air can enter the plenum 504 through dampers 576, and then can pass through the exchanger 510 and the dry coil 512. In a third operating mode, which can also be referred to as an enhanced mode or a super evaporation mode, the cooling system 501 can run using both the pre-cooler 560 and the dry coil 512. Under extreme conditions, or when the outdoor air is hot or humid, the cooling system 501 can provide pre-cooling to the scavenger air, using the pre-cooler 560, before the scavenger air enters the exchanger 510. The pre-cooler 560 can be used to improve the cooling power of the system 501, allowing the exchanger 501 to achieve lower discharge temperatures at the outlet 518 of the exchanger 510. The pre-cooler 560 can reduce or eliminate a need for supplemental mechanical cooling.

The flow of water into the exchanger 510 through a water inlet 516 can also depend on an operating mode of the cooling system 501. Similar to the cooling systems described above, the water exiting the dry coil 512 through a water line 530 can be split into a water line 530a to the exchanger 510 and a water line 530b to the tank 522, depending on whether the cooling system 501 is operating in the economizer mode. A bypass valve 532 can control the flow of water from the dry coil 512 to the tank 522 and the exchanger 510. The water exiting the pre-cooler 560 can be directed to the inlet 516 of the exchanger 510 through a water line 578. A junction 580 of the water lines 578 and 530a is shown in FIG. 5. It is recognized that the water lines 578 and 530a do not have to merge or join together prior to the inlet 516 and two separate water lines can be in fluid connection with the inlet 516.

The conditioning system 500 can include a control system to control operation of the cooling system 501 and control an amount of cooling provided from the cooling system 501 to the data center 502. Such control system can be manual or automated, or a combination of both. The conditioning system 500 can be operated so that a temperature of the water in the tank 522 can be equal to a setpoint temperature that can be constant or variable. In a conditioning system 500 including a LLHX and a secondary coolant loop, the conditioning system 500 can be operated so that a temperature of the coolant leaving the LLHX (see, for example, the line 446 of FIG. 4) can be equal to a setpoint temperature that can be constant or variable. Controlling to the temperature of the coolant can be in addition to or as an alternative to controlling to the temperature of the water in the tank 522 or the water leaving the tank 522. The setpoint temperature can be determined based in part on the cooling requirements of the data center 502. The cooling system in the data center 502 can use the water or coolant delivered to the data center 502 from the cooling system 501 to cool the air in the data center 502 or to cool one or more electrical components in the data center 502. The conditioning system 500 can be controlled to reduce overall water usage and power consumption, and increase heat rejection from the data center 502.

Operation of the conditioning system 500 can be aimed at increasing the portion of sensible heating between the water and the scavenger air and decreasing the portion of latent heating between the water and the scavenger air. Water evaporation inside the LAMEE or exchanger 510 can be optimized to minimize water consumption in the cooling system 501 by at least one of using cooling coils before or after the exchanger 510 and modulating a scavenger air flow rate through the system 501. A greater portion of the heat load can be rejected in the dry coil 512 downstream of the exchanger 510, if the water returning to the system 501 is at a higher temperature. As a result, the scavenger air temperature at an outlet of the dry coil 512 can be higher. The LAMEE 510 can consume less water when the latent portion of the work performed in the LAMEE is reduced.

In an example, the cooling system 501 can be operated in an economizer mode in which the LAMEE 510 is turned off and bypassed so long as the setpoint temperature of the water delivered to the tank can be met using the dry coil 512. However, if the water in the tank is at a temperature above the setpoint, the cooling system 501 can be operated in a normal mode which includes using the LAMEE 510 to cool the water. Similarly, if the setpoint temperature cannot be achieved in the normal mode, an enhanced mode can include using the pre-cooler 560 to condition the scavenger air before the scavenger air enters the LAMEE 510.

Other conditioning systems described herein and shown in FIGS. 1-4 and 6-7 can similarly include a control system for operating the cooling systems.

In other examples, the cooling system 501 could include a LLHX as part of a secondary coolant loop such that a coolant provides the cooling to the data center 502. In other examples, the cooling system 501 can include a DX coil inside the tank 522.

In an example, a conditioning system can include multiple cooling systems that can be similar to the cooling system 501 or any of the other cooling systems described herein and shown in FIGS. 1-4 and 6-7. Multiple cooling systems can produce reduced-temperature water streams, which can be delivered to a master storage tank. Operation of the multiple cooling systems can depend in part on a temperature of the water in the master tank. In an example, the cooling systems may be configured to operate more during the night when the outdoor air is cooler or operate more at certain periods in the day based on the cooling loads of the data center 502 or other enclosed space. The conditioning systems described herein and shown in FIGS. 1-7 can be well suited for enclosed spaces that have a continuous cooling load or a variable cooling load.

Figure 6:
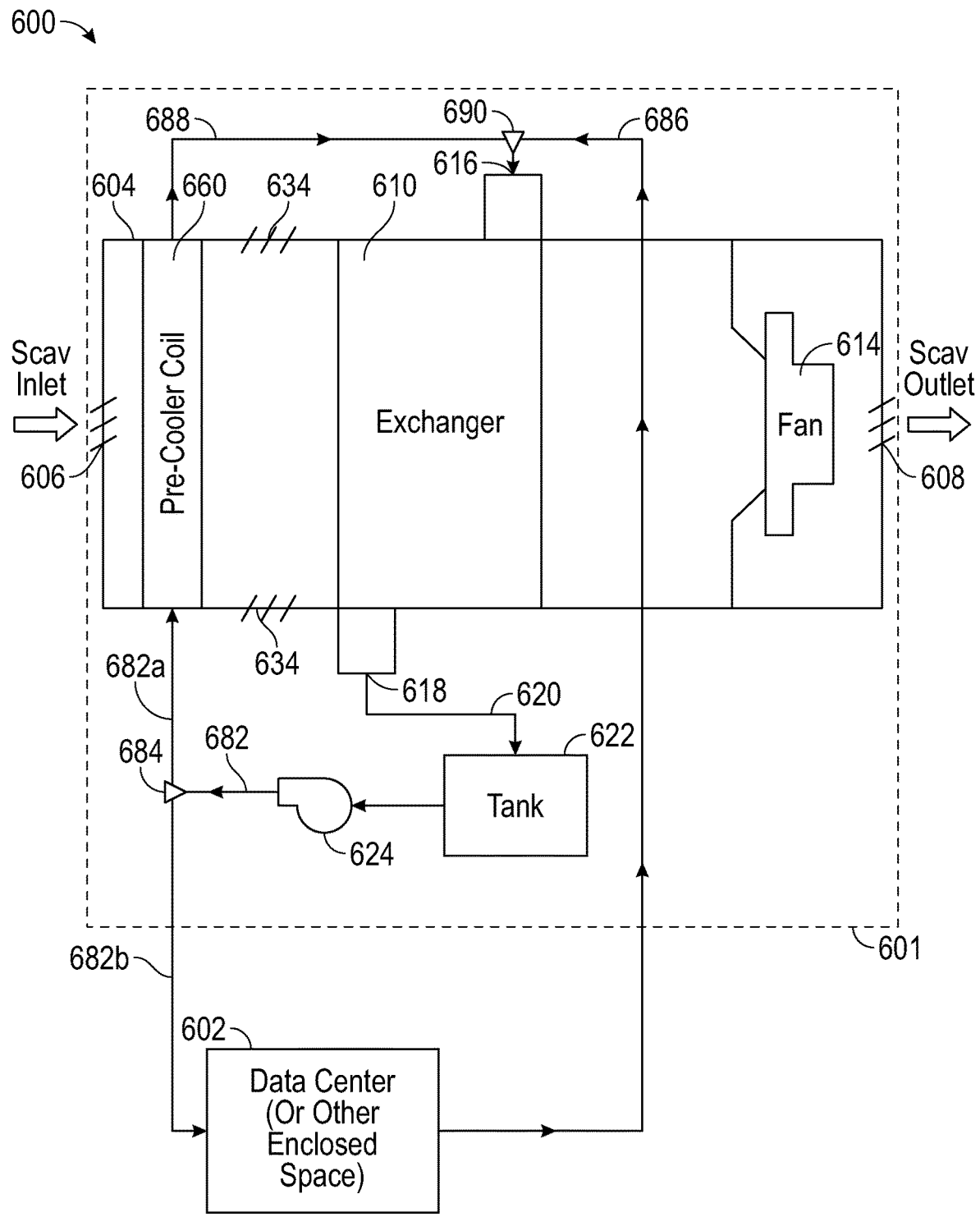
FIG. 6 is a schematic of an example conditioning system in accordance with the present patent application.

FIG. 6 depicts an example conditioning system 600 having a cooling system 601 for providing cooling to a data center (or other enclosed space) 602. The cooling system 601 can be similar to the cooling system 401 of FIG. 4 in that a dry coil/pre-cooler 660 can be arranged inside a plenum 604 upstream of an exchanger 610. However, in contrast to the cooling system 401 in which the pre-cooling coil 460 can receive the increased-temperature water from the LLHX 442 (or from the data center 402), the pre-cooler 660 can receive the reduced-temperature water from the tank 622. The water can exit the tank 622 through a water line 682 using a pump 624. A bypass valve 684 can split the water from the water line 682 into a water line 682a to the pre-cooler 660 and a water line 682b to the data center 602. In other examples, the water line 682b can pass to a LLHX that is part of a secondary coolant loop such that a coolant can be cooled with the water and the coolant can then be delivered to the data center 602.

The water exiting the pre-cooler 660 can pass back through the exchanger 610 via a water line 688. A valve 690 can control a flow of water from the pre-cooler 660 and from the data center 602 into the exchanger 610 at inlet 616. Water from the data center 602 can go directly back to the exchanger 610 through a water line 686. As such, the increased-temperature water can be returned to the exchanger 610 without having any pre-cooling performed on the increased-temperature water. The increased-temperature water entering the exchanger 610 can produce high evaporation rates (a significant amount of heat can be rejected as latent heat). The relative water consumption of the system 601 can be higher compared to other cooling system designs. The size of the system 601 can be more compact and require less scavenger air flow for the same amount of heat rejection, compared to other cooling system designs.

In the design of the cooling system 601 in which the water from the tank is split into lines 682a and 682b, the bypass valve 684 can be used to control what portion of the water goes to the pre-cooling coil 660 and what portion goes to the data center 602. The splitting ratio can be varied to control the mass flow rate to each of the pre-cooler 660 and the data center 602. This can enable the coldest-temperature water in the system 601 (from the tank 622) to go to the pre-cooling coil 660, maximizing its ability to lower the wet bulb temperature of the scavenger air and depress achievable cooling temperatures of the water in the exchanger 610 as much as possible. If colder water is sent to the pre-cooler 660, the pre-cooler 660 can further cool the scavenger air entering the plenum 604, providing greater potential for evaporation inside the exchanger 610. If the pre-cooler 660 is not needed in order for the water in the tank 622 to meet the setpoint temperature (and thus meet the cooling load of the data center 602), essentially all of the water exiting the tank 622 can be delivered to the data center 602 through the line 682b.

It is recognized that this control of the water distribution between two or more water lines can also be used in any of the other cooling system designs, including the system 500 of FIG. 5 in which two water lines (520 and 574) are shown exiting the tank 522.

The plenum 604 can include one or more bypass dampers 634 which can be used to direct the scavenger air into the plenum 604 at a location downstream of the pre-cooling coil 660.

In other examples, the cooling system 601 can include a DX coil inside the tank 622 to provide additional cooling to the water in the tank 622.

Figure 7:
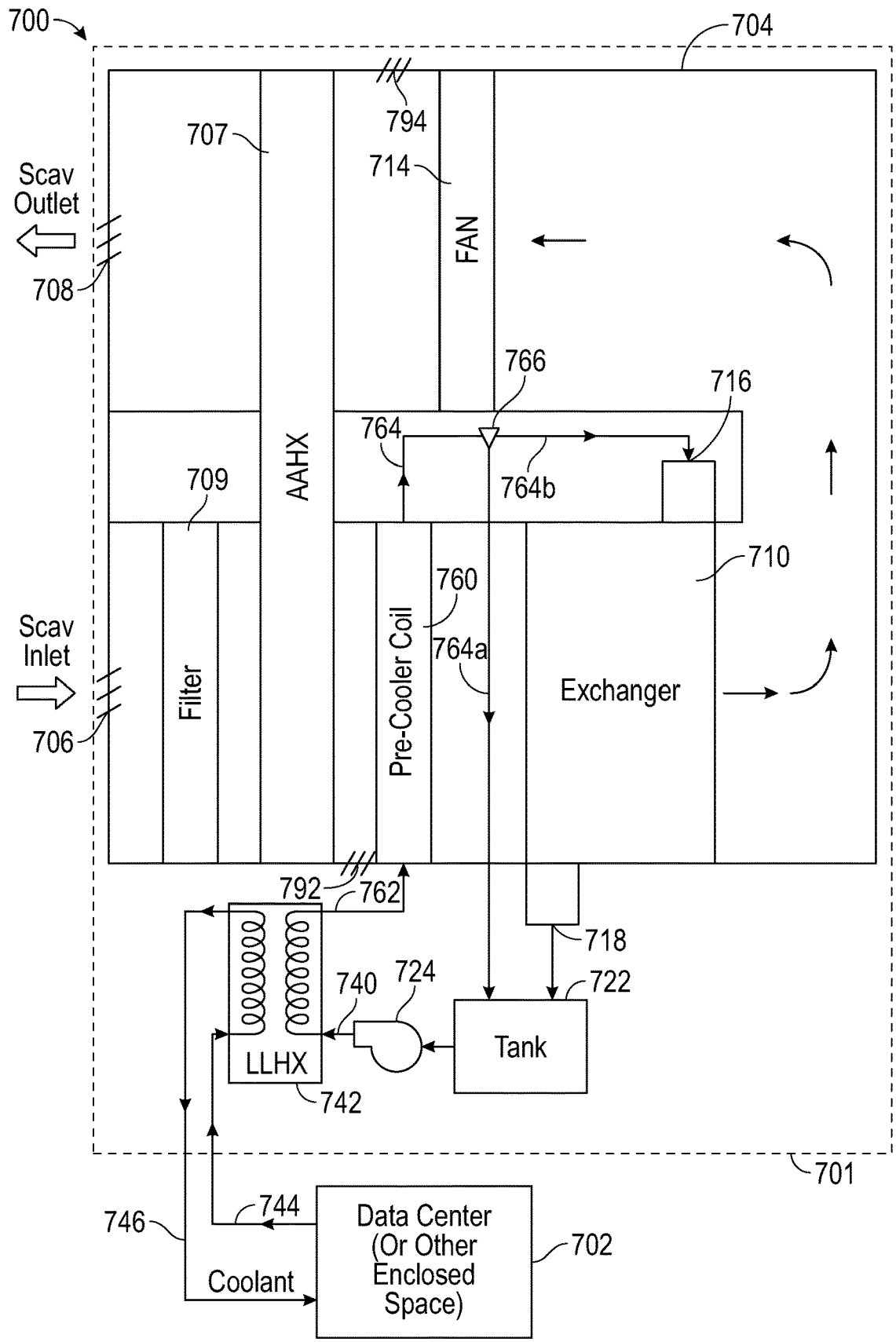
FIG. 7 is a schematic of an example conditioning system in accordance with the present patent application.

FIG. 7 depicts an example conditioning system 700 having a cooling system 701 for providing cooling to a data center (or other enclosed space) 702. The cooling system 701 can be similar to the cooling system 401 of FIG. 4 and can include an exchanger 710 and a pre-cooling coil or pre-cooler 760 located upstream of the exchanger 710. The system 701 can also include an air-to-air heat exchanger (AAHX) 707, which can include, but is not limited to, a heat wheel, heat pipe, cross flow flat-plate AAHX or counter flow flat-plate AAHX.

The scavenger air can enter the plenum 704 at a scavenger air inlet 706, pass through a filter 709 and then pass through the AAHX 707. The scavenger air can be indirectly and sensibly cooled in the AAHX 707 using the scavenger air exiting the exchanger 710. The cooling system design of FIG. 7 can be used for hot or humid outdoor air conditions to eliminate or reduce a need for additional DX cooling to precool the scavenger air entering the plenum 704.

After the scavenger air exits the AAHX 707, the scavenger air can pass through the pre-cooler 760 in a second stage of cooling the scavenger air, in which the wet bulb temperature of the air can be further depressed, thereby increasing the cooling potential in the exchanger 710. After the scavenger air exits the exchanger 710 at a reduced temperature, the cold air can pass through a fan 714 and the AAHX 707 to cool the outside air entering the plenum 704 at the scavenger air inlet 706. The scavenger air can then exit the plenum 704 as exhaust air at the scavenger air outlet 708.

A flow path of the water through the system 701 can be similar to the configuration in the cooling system 401 of FIG. 4. A bypass valve 766 can be used to control the flow of water from the pre-cooler 760 to the tank 722 (via a line 464a) and to the exchanger 710 (via a line 464b), depending in part on the outdoor air conditions and the operating mode of the system 701.

In mild conditions or in winter, some or essentially all of the water exiting the pre-cooler 760 can be directed back to the tank 722 and the water may not pass through the exchanger 710. In those conditions, the AAHX 707 can also be turned off, in which case the scavenger air can still enter the plenum 704 at the inlet 706, or the AAHX 707 can be bypassed by directing the scavenger air into the plenum 704 through bypass dampers 792 between the AAHX 707 and the pre-cooler 760. In some cases, the scavenger air can still pass through the exchanger 710 even if water is not being circulated through the exchanger 710, and the scavenger air can exit the plenum through bypass dampers 794 located downstream of the fan 714 and before the AAHX 707. In other designs, the fan 714 can be in a different location within the plenum 704. In an example, the fan 714 can be moved upstream of the pre-cooler 760 and the exchanger 710, and a bypass could be included after the fan 714 for directing the scavenger air out of the plenum 714.

In an example, the outdoor air conditions can be such that the AAHX 707 can be used for cooling the scavenger air entering the plenum 704 and the pre-cooler coil 760 can be bypassed by one or both of the air and the water. It is recognized that various configurations of dampers and bypasses can be included in the cooling system 701 to improve energy efficiency and operation of the system 701 depending on the outdoor air conditions.

In other examples, the cooling system 701 can eliminate the LLHX 742 and the reduced-temperature water can be delivered directly from the tank 722 to the data center 702.

Various configurations of cooling systems having a LAMEE and other components arranged inside a scavenger air plenum are described above and illustrated in FIGS. 1-7. Any of the configurations described above can use the water to provide cooling to the data center or any of the configurations described above can include a secondary coolant loop to use the cold water to cool a coolant which can be delivered to the data center. It is recognized that some of the components in the cooling system do not have to be arranged in the specific manner illustrated in the figures and alternative configurations are included in the scope of the present application. For example, a fan can be located upstream or downstream of the exchanger, a fan can be located upstream or downstream of a condenser coil that is part of a refrigerant loop. A filter is included in the cooling systems 401 and 701 of FIGS. 4 and 7, respectively (see filters 409 and 709). It is recognized that a filter can be included near an inlet of any of the plenums of the other cooling systems of FIGS. 1-3, 5 and 6. It is recognized that additional components can be included in the cooling systems described above and illustrated in FIGS. 1-7. In an example, any of the conditioning systems of FIGS. 1-7 can include a water treatment device which can control a quality of the water circulating through the conditioning systems.

Figure 8:
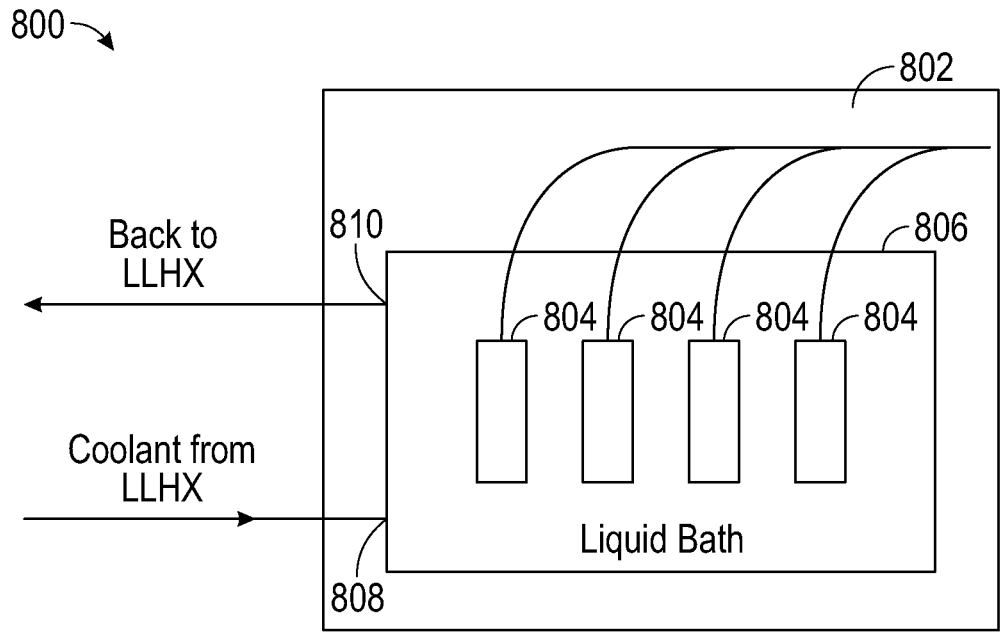
FIG. 8 is a schematic of an example cooling system in accordance with the present patent application.
Figure 9:
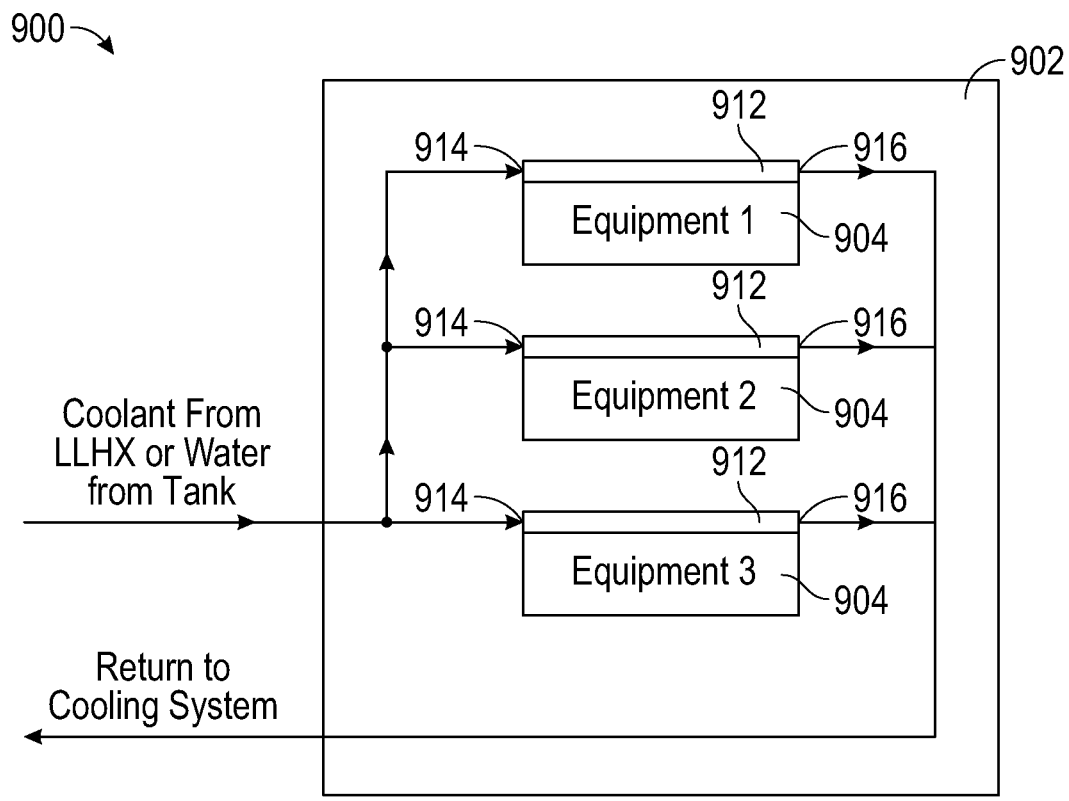
FIG. 9 is a schematic of an example cooling system in accordance with the present patent application.
Figure 10:
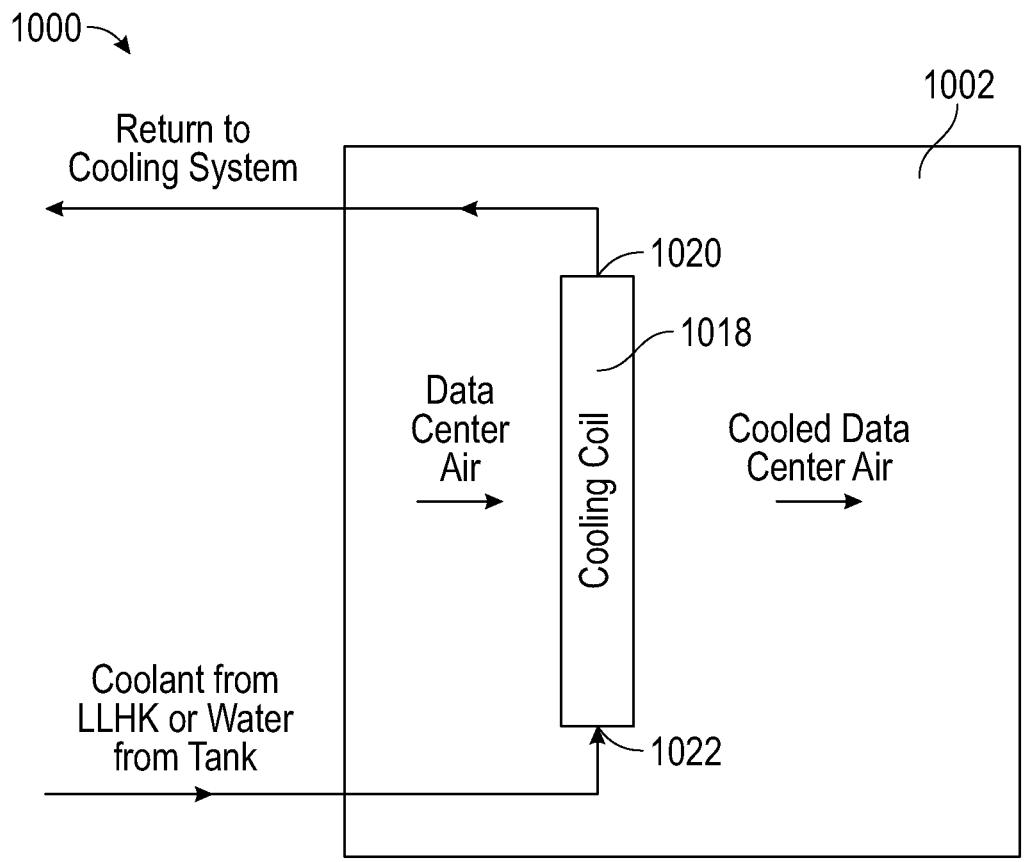
FIG. 10 is a schematic of an example cooling system in accordance with the present patent application.

As described above, reduced-temperature water from a LAMEE can be used to provide cooling to a data center or other enclosed space. The reduced-temperature water can be delivered to the enclosed space or the reduced-temperature water can cool a coolant in a secondary coolant loop such that the coolant can be delivered to the enclosed space. The water or coolant can cool the enclosed space using any known methods for rejecting heat from the space with a liquid (water or coolant). FIGS. 8-10 illustrate examples of cooling systems that can be used to cool the enclosed space. It is recognized that a combination of cooling systems can be used inside the enclosed space.

FIG. 8 depicts an example cooling system 800 that can be located inside a data center 802 or other enclosed space. The cooling system 800 can use immersing technology to provide liquid cooling to IT equipment or electrical components 804 that can be immersed in a liquid bath 806. The liquid bath 806 can be formed of coolant from a secondary coolant loop having a LLHX in which the coolant can be cooled using reduced-temperature water from any of the cooling systems in FIGS. 1-7 described above using a LAMEE. The coolant can enter the liquid bath 806 at an inlet 808 to provide cooling to the components 804 immersed in the coolant and can reject essentially 100% of the heat from the components 804. The coolant can exit the liquid bath 806 at an outlet 810 at an increased temperature, relative to a temperature at the inlet 808. The coolant can be circulated back to the LLHX in the secondary coolant loop such that the reduced-temperature water passing through the LLHX can cool the coolant for delivery back to the cooling system 800.

The cooling system 800 is shown in FIG. 8 having four electrical components 804. It is recognized that more or less electrical components 804 can be cooled in the cooling system 800. In an example, the data center 802 can contain multiple cooling systems 800, each of which may cool a plurality of electrical components 804. The coolant delivered to the data center 802 can come from a single cooling system described above and shown in FIGS. 1-7 and such cooling system can have sufficient cooling capacity to provide cooling across the multiple cooling systems 800. Alternatively, the coolant to the data center 802 can be from multiple cooling systems selected from any of the designs described above and shown in FIGS. 1-7, each of which has a LAMEE in combination with other components to produce cold water.

In an example, the coolant in the liquid bath 806 can be a specific non-conductive liquid with high thermal capacity and have properties sufficient to satisfy requirements for liquid immersing technologies.

FIG. 9 depicts an example cooling system 900 that can be located inside a data center 902 or other enclosed space. The cooling system 900 can use cold-plate technology to provide liquid cooling to IT equipment or electrical components 904 inside the data center 902.

In an example, cold water from the cooling systems described above and shown in FIGS. 1-7 can be delivered from the storage tank to the data center 902 and distributed to each of the electrical components 904. The water can pass through microchannels in a cold plate 912 that is attached to and in direct contact with each of the electrical components 904. The water can pick up a portion of the heat from the electrical components 904 such that a temperature of the water at an outlet 916 of each plate 912 is higher than a temperature of the water at an inlet 914 of each plate 912. The increased-temperature water can then be returned to the cooling system and recirculated back through the cooling system as described above and shown in FIGS. 1-7.

In an example, a coolant can be delivered to the data center 902 and distributed to each of the electrical components 904. The coolant can be any suitable coolant for circulation through the cold plates 912. The coolant can be cooled in a secondary coolant loop prior to being delivered to the data center 902 as described above. After the coolant passes through the cold plates 912, rejecting heat from the components 904, the increased-temperature coolant can be returned to a LLHX in the secondary coolant loop such that the coolant can be cooled back down for recirculation back to the cooling system 900.

If water is used in the cooling system 900, in an example, the water may need to be treated prior to passing the water through the cold plates 912 to ensure the water is sufficiently clean. An air cooling system can also be used to provide cooling to the data center 902 since the cooling system 900 may not be able to reject 100% of the heat from the electrical components 904.

The cooling system 900 is shown in FIG. 9 having three electrical components 904, each with a cold plate 912. It is recognized that more or less electrical components 904 can be cooled in the cooling system 900. In an example, the data center 902 can contain multiple cooling systems 900, each of which may cool a plurality of electrical components 904. The water or coolant delivered to the data center 902 can come from a single cooling system described above and shown in FIGS. 1-7 and such cooling system can have sufficient cooling capacity to provide cooling across the multiple cooling systems 900. Alternatively, the water or coolant can from multiple cooling systems selected from any of the designs described above and shown in FIGS. 1-7, each of which has a LAMEE in combination with other components to produce cold water or coolant.

FIG. 10 depicts an example cooling system 1000 that can be located inside a data center 1002 or other enclosed space. The cooling system 1000 can use a cooling coil 1018 to provide cooling to the air in the data center 1002. The cold water or coolant from any of the cooling systems of FIGS. 1-7 can flow through the cooling coil 1018. As the data center air flows over the cooling coil 1018, the data center air can be sensibly cooled by the water or coolant in the coil 1018. As such, a temperature of the data center air downstream of the cooling coil 1018 can be less than a temperature of the data center air upstream of the cooling coil 1018. The temperature of the water or coolant at an outlet 1020 of the coil 1018 can be greater than a temperature of the water or coolant at an inlet 1022 of the coil 1018. The increased-temperature water or coolant exiting the cool 1018 can be returned to the cooling system and recirculated back through the cooling system as described above and shown in FIGS. 1-7.

The cooling coil 1018 can be configured in the data center 1002 in any number of ways. The data center 1002 can include one or more cooling coils 1018 depending on the cooling capacity of the coil 1018 and the cooling load in the data center 1002. In an example, the cooling coil 1018 can be configured as a rear door heat exchanger and attach to the back of a component, including, for example, an electrical component in the data center 1002. The data center air can pass through one or more components in a cabinet and the data center air can pick up the heat from the components. The increased temperature air can then pass through the rear door heat exchanger, where cooling of the air can occur, and then exit the cabinet. In an example, the cooling coil 1018 can be positioned above one or more electrical components and the data center air can be directed up to the cooling coil 1018.

In examples, a data center or enclosed space can have multiple cooling systems, including any combination of those shown in FIGS. 8-10. The water or coolant supplied to the data center can come from multiple cooling systems including any combination of those shown in FIGS. 1-7 or a single cooling system selected from any of those shown in FIGS. 1-7 can be used to provide cooling to the data center.

Figure 11:
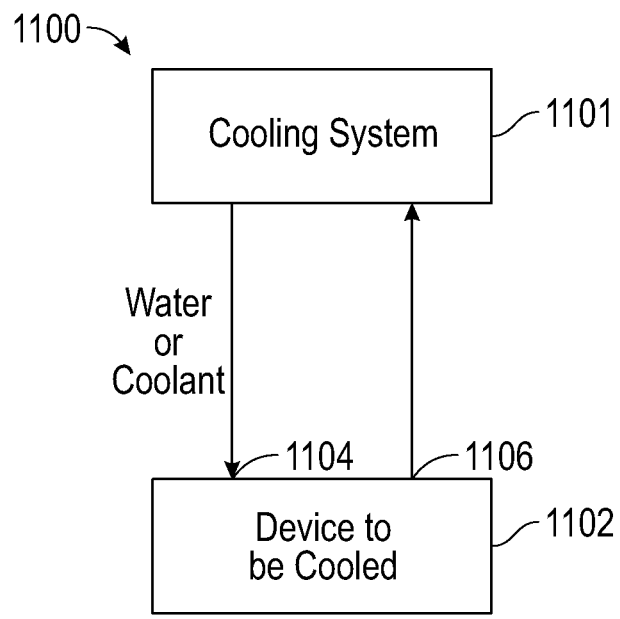
FIG. 11 is a schematic of an example conditioning system in accordance with the present patent application.

FIG. 11 depicts an example conditioning system 1100 for providing cooling to a device 1102. The conditioning system 1100 can include a cooling system 1101 that can be similar to any of the cooling systems 101, 201, 301, 401, 501, 601, and 701 of FIGS. 1-7 and can include a LAMEE, and any of the other components and features described above in combination with the LAMEE, to form the cooling system 1101.

The cooling system 1101 can produce reduced-temperature water or coolant, using an evaporative cooler LAMEE, and the reduced-temperature water or coolant can be delivered to the device 1102 to be cooled. The cooling system 1101 can be located separate from and remote to the device 1102 and the reduced-temperature water or coolant can be transported or delivered to the device 1102. In an example, the device 1102 is not in an enclosed space, such that the device 1102 can be open to the atmosphere and an exterior of the device 1102 can be exposed to outdoor air. The example conditioning system of FIG. 11 is thus distinguished from previous examples in that the conditioning products (water or other fluid coolant) of the cooling system 1101 can be delivered to a device or other piece of equipment or system that is not arranged within an enclosed space.

The conditioning system 1100 can be configured such that the reduced-temperature water or coolant from the cooling system 1101 can be delivered to an inlet 1104 of the device 1102 at an inlet temperature. The cooling liquid can reject heat from the device 1102 such that the water or coolant leaving the device at an outlet 1106 can be at an outlet temperature that is higher than the inlet temperature. The increased-temperature liquid exiting the device 1102 can be recirculated back to the cooling system 1101 where the water or coolant can be cooled again, as described above.

The device 1102 can include any type of equipment or component that generates heat or any type of equipment or component that uses a fluid for heat rejection. The reduced-temperature water or coolant from the cooling system 1101 can reject heat from the device 1102 using any known method, including those described above and shown herein. In an example, the reduced-temperature water or coolant can directly cool the device 1102. The reduced-temperature water or coolant from the cooling system 1101 can circulate through channels formed in the device 1102, as similarly described in reference to the cold plates 912 of the cooling system 900 of FIG. 9. In an example, the reduced-temperature water or coolant can be circulated through a liquid to liquid heat exchanger (LLHX) inside the device 1102 and the water or coolant can pick up heat from a second fluid circulating through the LLHX to reduce a temperature of the second fluid. The device 1102 can include, but is not limited to, industrial equipment, commercial equipment, a chiller, a condenser coil, or any equipment (or in any process) using a cooling tower for heat rejection. The device 1102 can include any type of equipment or component that can use water or another cooling fluid to reject heat from the equipment/component or from a liquid in, or associated with, the equipment/component.

It is recognized that the cooling system 1101 can be used to provide cooling to more than one device, depending on a cooling load of each of the devices and a cooling capacity of the system 1101. In an example, the device 1102 of FIG. 11 can include a plurality of pieces of industrial equipment; each piece of equipment can receive reduced-temperature water or coolant which can come from a central cooling system 1101 or from a separate cooling system 1101 dedicated to each piece of equipment.

The present application includes methods of operating a conditioning system, having at least one cooling system, to control conditions in an enclosed space, such as, for example, a data center. The methods can include directing scavenger air through a liquid to air membrane energy exchanger (LAMEE) arranged inside a scavenger air plenum disposed outside of the enclosed space. The scavenger air can enter the plenum at an air inlet and exit the plenum at an air outlet. The scavenger air plenum and the LAMEE can form a cooling system disposed outside of the enclosed space. The methods can include also directing water through the LAMEE such that the LAMEE has a water flow path separate from an air flow path, and evaporatively cooling takes place reducing a temperature of the scavenger air and the water to the outdoor air wet bulb temperature, depending on the air conditions. The methods can include delivering a cooling fluid in a cooling fluid circuit to the enclosed space, wherein the cooling fluid circuit can be connected to the water flow path of the LAMEE, and providing cooling to the enclosed space with the cooling fluid and without moving air from the enclosed space through the cooling system. The cooling fluid in the cooling fluid circuit can be the reduced-temperature water from the LAMEE or a coolant cooled with the reduced-temperature water. Cooling the enclosed space can include air cooling of the air in the enclosed space or direct contact of the cooling fluid with one or more electrical components in the enclosed space.

The present application includes methods of operating a conditioning system, having at least one cooling system, to provide cooling to one or more devices that are not contained in an enclosed space, but rather the one or more devices can be open to the atmosphere. The methods can include producing reduced-temperature water with a LAMEE, as described above, and delivering reduced-temperature water or coolant to the one or more devices to be cooled. The method can include cooling the one or more devices directly with the reduced-temperature water or coolant, or circulating the reduced-temperature water or coolant through a heat exchanger inside the device to cool a second fluid circulating through the heat exchanger.

The methods above of operating a conditioning system can include storing the reduced-temperature water in a tank after the water exits the LAMEE. The methods can include providing additional cooling to the water in the tank prior to using the water to provide cooling to the enclosed space or device, using, for example, a DX coil inside the tank. The methods can include directing the reduced-temperature water from the LAMEE through a liquid to liquid heat exchanger (LLHX) to decrease a temperature of a coolant in the cooling fluid circuit and delivering the reduced-temperature coolant to the enclosed space or to the device.

The methods can include operating a cooling system of the conditioning system in different modes depending on at least one of the outdoor air conditions and a setpoint temperature of the water or coolant to be delivered to the enclosed space or device. The methods can include operating the cooling system in an economizer mode in which the scavenger air and the water can bypass the LAMEE and cooling of the water can be performed by a dry coil arranged insider the scavenger air plenum. The methods can include operating the cooling system in an enhanced mode and directing the scavenger air through a pre-cooling unit arranged in the scavenger air plenum upstream of the LAMEE to condition the scavenger air prior to directing the scavenger air through the LAMEE.

The above description is intended to be illustrative, and not restrictive. For example, the above-described examples (or one or more aspects thereof) may be used in combination with each other. Other embodiments can be used, such as by one of ordinary skill in the art upon reviewing the above description.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a conditioning system for controlling conditions in an enclosed space and can comprise a cooling system and a cooling fluid circuit. The cooling system can be disposed outside of the enclosed space and include a scavenger air plenum and a liquid to air membrane energy exchanger (LAMEE) arranged inside the plenum. The plenum can be configured to direct scavenger air in an air flow path from an air inlet to an air outlet of the plenum. The LAMEE can comprise a cooling fluid flow path separate from the air flow path by a membrane. The LAMEE can use the scavenger air to evaporatively cool a cooling fluid in the cooling fluid flow path such that a temperature of the cooling fluid at a fluid outlet of the LAMEE is lower than a temperature of the cooling fluid at a fluid inlet of the LAMEE. The cooling fluid circuit can be connected to the cooling fluid flow path of the LAMEE and extend from the plenum into the enclosed space. The cooling fluid circuit can be configured to provide cooling to the enclosed space without moving air from the enclosed space through the cooling system.

Example 2 provides the system of Example 1 optionally further comprising a cooling unit arranged inside the plenum upstream of the LAMEE, the cooling unit configured to condition the scavenger air prior to the scavenger air entering the LAMEE.

Example 3 provides the system of Example 2 optionally configured such that the cooling unit is configured to receive reduced-temperature water from the LAMEE to condition the scavenger air.

Example 4 provides the system of any of Examples 1-3 optionally configured such that the cooling fluid circuit is configured to transport the cooling fluid from the LAMEE to the enclosed space to provide cooling to the enclosed space.

Example 5 provides the system of any of Examples 1-4 optionally configured such that the cooling fluid in the cooling fluid flow path of the LAMEE is water.

Example 6 provides the system of any of Examples 1-5 optionally configured such that the cooling fluid circuit includes a first cooling fluid and a second cooling fluid, and wherein the first cooling fluid is the cooling fluid from the LAMEE.

Example 7 provides the system of Example 6 optionally configured such that the cooling fluid circuit includes a liquid to liquid heat exchanger configured to receive the first and second cooling fluids to reduce a temperature of the second cooling fluid.

Example 8 provides the system of any of Examples 6 or 7 optionally configured such that the second cooling fluid is delivered to the enclosed space and provides cooling to the enclosed space.

Example 9 provides the system of any of Examples 1-8 optionally further comprising a storage tank to store the cooling fluid from the LAMEE.

Example 10 provides the system of Example 9 optionally further comprising a mechanical cooling system to cool the cooling fluid in the storage tank.

Example 11 provides the system of any of Examples 1-10 optionally further comprising a cooling coil arranged inside the plenum downstream of the LAMEE and configured to use the scavenger air to cool the cooling fluid.

Example 12 provides the system of Example 11 optionally further comprising a bypass valve configured to control a flow of the cooling fluid, exiting the cooling coil, to at least one of the LAMEE and a tank configured to store the cooling fluid.

Example 13 provides the system of Example 12 optionally further comprising a first operating mode in which at least a portion of the cooling fluid exiting the cooling coil is recirculated back to the LAMEE and a second operating mode in which essentially all of the cooling fluid exiting the cooling coil is recirculated back to the storage tank.

Example 14 provides a conditioning system for controlling conditions in an enclosed space and can comprise a first cooling system disposed outside of the enclosed space, a second cooling system disposed inside of the enclosed space, and a cooling fluid circuit. The first cooling system can comprise a scavenger air plenum having an air inlet and outlet, the plenum configured to direct scavenger air in an air flow path from the air inlet to the air outlet, and a liquid to air membrane energy exchanger (LAMEE) arranged inside the plenum. The LAMEE can comprise a water flow path separated from the air flow path by a membrane, the LAMEE configured to use the scavenger air to reduce a temperature of water in the water flow path. The cooling fluid circuit can be connected to the water flow path of the LAMEE and to the second cooling system. The cooling fluid circuit can provide cooling to the enclosed space without moving air from the enclosed space through the first cooling system.

Example 15 provides the system of Example 14 optionally configured such that the cooling fluid circuit includes a liquid to liquid heat exchanger (LLHX). The water from the LAMEE can pass through the LLHX to reduce a temperature of a second cooling fluid used in the second cooling system.

Example 16 provides the system of Example 15 optionally configured such that the second cooling system includes direct cooling from the second cooling fluid to one or more components in the enclosed space.

Example 17 provides the system of any of Examples 15 or 16 optionally configured such that the second cooling system includes cooling of air in the enclosed space using the second cooling fluid.

Example 18 provides the system of Example 14 optionally configured such that the second cooling system uses reduced-temperature water from the LAMEE and the reduced-temperature water is delivered to the enclosed space.

Example 19 provides the system of Example 18 optionally configured such that the reduced-temperature water directly cools one or more components in the enclosed space.

Example 20 provides the system of any of Examples 18 or 19 optionally configured such that the second cooling system includes a cooling coil configured to receive the reduced-temperature water and cool air in the enclosed space that passes over the cooling coil.

Example 21 provides the system of any of Examples 14-20 optionally configured such that the second cooling system includes at least one of a cooling coil, a rear door heat exchanger, a cooling distribution unit (CDU), a cold plate, and a liquid cooling bath.

Example 22 provides a conditioning system for controlling conditions in an enclosed space and can comprise a cooling system disposed outside of the enclosed space and a cooling fluid circuit. The cooling system can comprise a scavenger air plenum having an air inlet and outlet, and configured to direct scavenger air in an air flow path from the air inlet to the air outlet. The cooling system can comprise a liquid to air membrane energy exchanger (LAMEE) arranged inside the plenum in the air flow path. The LAMEE can comprise a cooling fluid flow path separated from the air flow path by a membrane. The LAMEE can be configured to use the scavenger air to evaporatively cool a cooling fluid in the cooling fluid flow path such that a temperature of the cooling fluid at a fluid outlet of the LAMEE is lower than a temperature of the cooling fluid at a fluid inlet of the LAMEE. The cooling system can comprise a first cooling unit arranged inside the plenum between the air inlet and the LAMEE and a second cooling unit arranged inside the plenum between the LAMEE and the air outlet. The first cooling unit can be configured to condition the scavenger air prior to the scavenger air entering the LAMEE and the second cooling unit can be configured to reduce a temperature of the cooling fluid before the cooling fluid enters the LAMEE at the fluid inlet. The cooling system can comprise one or more bypass dampers configured to permit scavenger air to enter or exit the air flow path at one or more locations between the air inlet and outlet. The cooling fluid circuit of the conditioning system can be connected to the cooling fluid flow path of the LAMEE and extend from the plenum into the enclosed space. The cooling fluid circuit can provide cooling to the enclosed space without moving air from the enclosed space through the cooling system.

Example 23 provides the system of Example 22 optionally configured such that the cooling fluid circuit includes a tank for storing the cooling fluid from the LAMEE and a pump to deliver the cooling fluid to the enclosed space.

Example 24 provides the system of Example 23 optionally further comprising a supplemental cooling system configured to provide additional cooling to the cooling fluid in the tank.

Example 25 provides the system of Example 24 optionally configured such that the supplemental cooling system is a DX coil located inside the tank.

Example 26 provides the system of any of Examples 22-25 optionally configured such that the cooling system includes a bypass valve to control a flow of the cooling fluid to the LAMEE.

Example 27 provides the system of any of Examples 22-26 optionally configured such that the cooling fluid in the LAMEE is water.

Example 28 provides the system of any of Examples 22-27 optionally configured such that the water is delivered to the enclosed space to directly cool one or more components in the enclosed space or cool air in the enclosed space.

Example 29 provides the system of any of Examples 22-27 optionally configured such that the cooling fluid circuit includes the cooling fluid from the LAMEE, a second cooling fluid, and a liquid to liquid heat exchanger (LLHX). The cooling fluid from the LAMEE and the second cooling fluid can pass through the LLHX to reduce a temperature of the second cooling fluid.

Example 30 provides the system of Example 29 optionally configured such that the second cooling fluid is delivered to the enclosed space to directly cool one or more components in the enclosed space or cool air in the enclosed space.

Example 31 provides the system of any of Examples 22-30 optionally configured such that the one or more bypass dampers include a first set of bypass dampers configured to direct scavenger air into the air flow path at a location between the first cooling unit and the LAMEE.

Example 32 provides the system of any of Examples 22-31 optionally configured such that the one or more bypass dampers include a second set of bypass dampers configured to direct scavenger air into the air flow path at a location between the LAMEE and the second cooling unit.

Example 33 provides the system of any of Examples 22-32 optionally configured such that the enclosed space is a data center.

Example 34 provides a method of controlling conditions in an enclosed space. The method can include directing scavenger air through a liquid to air membrane energy exchanger (LAMEE) arranged inside a scavenger air plenum disposed outside of the enclosed space and directing water through the LAMEE. The scavenger air can enter the plenum at an air inlet and exit the plenum at an air outlet. The scavenger air plenum and the LAMEE can form a cooling system disposed outside of the enclosed space. The LAMEE can comprise a water flow path separate from an air flow path. The LAMEE can be configured to evaporatively cool the water using the scavenger air and reduce a temperature of the water. The method can include delivering a cooling fluid in a cooling fluid circuit to the enclosed space and providing cooling to the enclosed space with the cooling fluid and without moving air from the enclosed space through the cooling system. The cooling fluid circuit can be connected to the water flow path of the LAMEE.

Example 35 provides the method of Example 34 optionally further comprising directing the water through a cooling unit arranged inside the scavenger air plenum downstream or upstream of the LAMEE prior to recirculating the water back to the LAMEE.

Example 36 provides the method of any of Examples 34 or 35 optionally configured such that delivering the cooling fluid to the enclosed space comprises delivering the reduced-temperature water from the LAMEE to the enclosed space.

Example 37 provides the method of Example 36 optionally further comprising delivering the reduced-temperature water from the LAMEE to a storage tank prior to delivering the reduced-temperature water to the enclosed space.

Example 38 provides the method of any of Examples 34 or 35 optionally further comprising directing the reduced-temperature water from the LAMEE through a liquid to liquid heat exchanger (LLHX) to decrease a temperature of the cooling fluid in the cooling fluid circuit, prior to delivering the cooling fluid to the enclosed space.

Example 39 provides the method of any of Examples 34-38 optionally further comprising delivering the reduced-temperature water from the LAMEE to a storage tank, directing scavenger air through a cooling coil located downstream of the LAMEE, and directing water through the cooling coil after the cooling fluid has been delivered to the enclosed space and before the water is recirculated back through the LAMEE or back to the storage tank.

Example 40 provides the method of any of Examples 34-39 optionally configured such that providing cooling to the enclosed space with the cooling fluid includes at least one of directly cooling one or more components in the enclosed space with the cooling fluid or cooling air in the enclosed space with the cooling fluid.

Example 41 provides the method of any of Examples 34-40 optionally further comprising directing the reduced-temperature water from the LAMEE through a cooling coil arranged inside the plenum upstream of the LAMEE and directing the scavenger air through the cooling coil to condition the scavenger air before the scavenger air is directed through the LAMEE.

Example 42 provides a method of controlling conditions in an enclosed space and can include directing scavenger air through a pre-cooling unit arranged in a scavenger air plenum disposed outside of the enclosed space. The scavenger air can enter the plenum at an air inlet and exit the plenum at an air outlet. The pre-cooling unit can be configured to condition the scavenger air entering the plenum. The method can include directing water and the scavenger air exiting the pre-cooler through a liquid to air membrane energy exchanger (LAMEE) arranged inside the scavenger air plenum. The LAMEE can comprise a scavenger air flow path separate from a water flow path by a membrane. The LAMEE can evaporatively cool the water in the water flow path such that a temperature of the water at a water outlet of the LAMEE is lower than a temperature of the water at a water inlet. The method can include storing the cooled water exiting the LAMEE in a tank and delivering a cooling fluid in a cooling fluid circuit to the enclosed space. The cooling fluid circuit can be connected to the water flow path of the LAMEE and the cooling fluid can be the cooled water from the tank or a coolant that is cooled by the cooled water in a liquid to liquid heat exchanger (LLHX). The method can include cooling the enclosed space with the cooling fluid by performing at least one of air cooling of the air in the enclosed space and directly contacting the cooling fluid with one or more components in the enclosed space. The method can include directing increased-temperature water from the enclosed space or from the LLHX through a dry coil arranged inside the scavenger air plenum downstream of the LAMEE, the reduced-temperature scavenger air cooling the water. The method can include recirculating the water exiting the dry coil back through the LAMEE in a first operating mode and bypassing the LAMEE and the pre-cooling unit in a second operating mode. The LAMEE can be bypassed by directing the water exiting the dry coil back to the tank, and directing the scavenger air into the plenum at a location downstream of the LAMEE and upstream of the dry coil.

Example 43 provides the method of Example 42 optionally further comprising bypassing the pre-cooling unit in a third operating mode, when the outdoor air conditions are mild.

Example 44 provides the method of Example 43 optionally configured such that bypassing the pre-cooling unit in a third operating mode includes directing the scavenger air into the plenum at a location downstream of the pre-cooling unit and upstream of the LAMEE.

Example 45 provides the method of any of Examples 43 or 44 optionally configured such that bypassing the pre-cooling unit in a third operating mode includes one of directing all of the water exiting the tank to the enclosed space or directing all of the water to the LLHX.

Example 46 provides the method of any of Examples 42-45 optionally configured such that the pre-cooling unit uses cooled water from the tank to condition the scavenger air passing through the pre-cooling unit.

Example 47 provides a conditioning system for providing cooling to a device and can include a cooling system located separate from and remote to the device and a cooling fluid circuit. The cooling system can include a scavenger air plenum having an air inlet and outlet, the plenum configured to direct scavenger air in an air flow path from the air inlet to the air outlet, and a liquid to air membrane energy exchanger (LAMEE) arranged inside the plenum. The LAMEE can comprise a cooling fluid flow path separated from the air flow path by a membrane. The LAMEE can be configured to use the scavenger air to evaporatively cool a cooling fluid in the cooling fluid flow path such that a temperature of the cooling fluid at a fluid outlet of the LAMEE is lower than a temperature of the cooling fluid at a fluid inlet of the LAMEE. The cooling fluid circuit can be connected to the cooling fluid flow path of the LAMEE and extend from the plenum to the device. The cooling fluid circuit can be configured to provide cooling to the device.

Example 48 provides the system of Example 47 optionally configured such that the cooling fluid circuit is configured to transport the cooling fluid from the LAMEE to the device to provide cooling to the device.

Example 49 provides the system of Example 47 optionally configured such that the cooling fluid circuit includes a first cooling fluid and a second cooling fluid, and the first cooling fluid is the cooling fluid from the LAMEE.

Example 50 provides the system of Example 49 optionally configured such that the cooling fluid circuit includes a liquid to liquid heat exchanger configured to receive the first and second cooling fluids to reduce a temperature of the second cooling fluid, and wherein the second cooling fluid is transported to the device to provide cooling.

Example 51 provides the system of any one of Examples 47-50 optionally configured such that the device is contained within an enclosed space.

Example 52 provides the system of any one of Examples 47-50 optionally configured such that the device is open to the atmosphere and an exterior of the device is exposed to outdoor air.

Example 53 provides a method of providing cooling to a device and can include directing scavenger air through a liquid to air membrane energy exchanger (LAMEE) arranged inside a scavenger air plenum. The scavenger air can enter the plenum at an air inlet and exit the plenum at an air outlet. The scavenger air plenum and the LAMEE can form a cooling system separate from and remote to the device. The method can include directing water through the LAMEE, the LAMEE comprising a water flow path separate from an air flow path, the LAMEE configured to evaporatively cool the water using the scavenger air and reduce a temperature of the water. The method can include storing the reduced temperature water exiting the LAMEE in a tank. The method can include delivering a cooling fluid in a cooling fluid circuit to the device, the cooling fluid circuit connected to the water flow path of the LAMEE. The cooling fluid can be the reduced temperature water from the tank or a coolant that is cooled by the reduced temperature water in a liquid to liquid heat exchanger (LLHX). The method can include cooling the device with the cooling fluid and recirculating the cooling fluid back to the cooling system or to the LLHX.

Example 54 provides the method of Example 53 optionally configured such that cooling the device with the cooling fluid includes directing the cooling fluid through channels formed in an interior of the device to reject heat from the device.

Example 55 provides a system or method of any one or any combination of Examples 1-54, which can be optionally configured such that all steps or elements recited are available to use or select from.

Various aspects of the disclosure have been described. These and other aspects are within the scope of the following claims.

What is claimed is:

1. A conditioning system for controlling conditions in an enclosed space, the conditioning system comprising:
    a cooling system disposed outside of the enclosed space, the cooling system comprising:
        a scavenger air plenum having an air inlet and outlet, the scavenger air plenum configured to direct scavenger air in an air flow path from the air inlet to the air outlet; and
        a liquid to air membrane energy exchanger (LAMEE) arranged inside the scavenger air plenum, the LAMEE comprising a cooling fluid flow path separated from the air flow path by a membrane, the LAMEE configured to use the scavenger air to evaporatively cool a cooling fluid in the cooling fluid flow path, a temperature of the cooling fluid at a fluid outlet of the LAMEE is lower than a temperature of the cooling fluid at a fluid inlet of the LAMEE; and
        a cooling coil arranged inside the scavenger air plenum downstream of the LAMEE and configured to use the scavenger air to cool the cooling fluid; and
    a cooling fluid circuit connected to the cooling fluid flow path of the LAMEE and extending from the scavenger air plenum into the enclosed space, the cooling fluid circuit configured to provide cooling to the enclosed space without moving air from the enclosed space through the cooling system.

2. The conditioning system of claim 1 further comprising a cooling unit arranged inside the scavenger air plenum upstream of the LAMEE, the cooling unit configured to condition the scavenger air prior to the scavenger air entering the LAMEE.

3. The conditioning system of claim 2 wherein the cooling unit is configured to receive reduced-temperature water from the LAMEE to condition the scavenger air.

4. The conditioning system of claim 1 wherein the cooling fluid circuit is configured to transport the cooling fluid from the LAMEE to the enclosed space to provide cooling to the enclosed space.

5. The conditioning system of claim 1 wherein the cooling fluid in the cooling fluid flow path of the LAMEE is water.

6. The conditioning system of claim 1 wherein the cooling fluid circuit includes a first cooling fluid and a second cooling fluid, and wherein the first cooling fluid is the cooling fluid from the LAMEE.

7. The conditioning system of claim 6 wherein the cooling fluid circuit includes a liquid to liquid heat exchanger configured to receive the first and second cooling fluids to reduce a temperature of the second cooling fluid.

8. The conditioning system of claim 7 wherein the second cooling fluid is delivered to the enclosed space and provides cooling to the enclosed space.

9. The conditioning system of claim 1 further comprising a storage tank to store the cooling fluid from the LAMEE.

10. The conditioning system of claim 9 further comprising a mechanical cooling system cool the cooling fluid in the storage tank.

11. A conditioning system for controlling conditions in an enclosed space, the conditioning system comprising:
    a cooling system disposed outside of the enclosed space, the cooling system comprising:
        a scavenger air plenum having an air inlet and outlet, the scavenger air plenum configured to direct scavenger air in an air flow path from the air inlet to the air outlet;
        a liquid to air membrane energy exchanger (LAMEE) arranged inside the scavenger air plenum in the air flow path, the LAMEE comprising a cooling fluid flow path separated from the air flow path by a membrane, the LAMEE configured to use the scavenger air to evaporatively cool a cooling fluid in the cooling fluid flow path, a temperature of the cooling fluid at a fluid outlet of the LAMEE is lower than a temperature of the cooling fluid at a fluid inlet of the LAMEE;
        a first cooling unit arranged inside the scavenger air plenum between the air inlet and the LAMEE, the first cooling unit configured to condition the scavenger air prior to the scavenger air entering the LAMEE;
        a second cooling unit arranged inside the scavenger air plenum between the LAMEE and the air outlet, the second cooling unit configured to reduce a temperature of the cooling fluid before the cooling fluid enters the LAMEE at the fluid inlet; and
        one or more bypass dampers configured to permit scavenger air to enter or exit the air flow path at one or more locations between the air inlet and outlet; and
    a cooling fluid circuit connected to the cooling fluid flow path of the LAMEE and extending from the scavenger air plenum into the enclosed space, the cooling fluid circuit configured to provide cooling to the enclosed space without moving air from the enclosed space through the cooling system.

12. The conditioning system of claim 11 wherein the cooling fluid circuit includes a tank for storing the cooling fluid from the LAMEE and a pump to deliver the cooling fluid to the enclosed space.

13. The conditioning system of claim 12 further comprising a supplemental cooling system configured to provide additional cooling to the cooling fluid in the tank.

14. The conditioning system of claim 13 wherein the supplemental cooling system is a DX coil located inside the tank.

15. The conditioning system of claim 11 wherein the one or more bypass dampers include a first set of bypass dampers configured to direct scavenger air into the air flow path at a location between the first cooling unit and the LAMEE.

16. The conditioning system of claim 11 wherein the one or more bypass dampers include a second set of bypass dampers configured to direct scavenger air into the air flow path at a location between the LAMEE and the second cooling unit.

17. The conditioning system of claim 11 wherein the enclosed space is a data center.

18. A conditioning system for controlling conditions in an enclosed space, the conditioning system comprising:
- a cooling system disposed outside of the enclosed space, the cooling system comprising:
  - a scavenger air plenum having an air inlet and outlet, the scavenger air plenum configured to direct scavenger air in an air flow path from the air inlet to the air outlet; and
  - a liquid to air membrane energy exchanger (LAMEE) arranged inside the scavenger air plenum, the LAMEE comprising a cooling fluid flow path separated from the air flow path by a membrane, the LAMFE configured to use the scavenger air to evaporatively cool a cooling fluid in the cooling fluid flow path, a temperature of the cooling fluid at a fluid outlet of the LAMEE is lower than a temperature of the cooling fluid at a fluid inlet of the LAMEE;
  - a cooling coil arranged inside the scavenger air plenum downstream of the LAMEE and configured to use the scavenger air to cool the cooling fluid; and
  - a bypass valve configured to control a flow of the cooling fluid, exiting the cooling coil, to at least one of the LAMEE and a tank configured to store the cooling fluid; and
- a cooling fluid circuit connected to the cooling fluid flow path of the LAMEE and extending from the scavenger air plenum into the enclosed space, the cooling fluid circuit configured to provide cooling to the enclosed space without moving air from the enclosed space through the cooling system.

* * * * *

UNITED STATES PATENT AND TRADEMARK OFFICE
CERTIFICATE OF CORRECTION

PATENT NO. : 11,143,430 B2
APPLICATION NO. : 15/574201
DATED : October 12, 2021
INVENTOR(S) : Ghadiri Moghaddam et al.

Page 1 of 1

It is certified that error appears in the above-identified patent and that said Letters Patent is hereby corrected as shown below:

On the Title Page

On page 5, in Column 2, Item (56) under "Other Publications", Line 28, delete ""Desicants" and insert --"Desiccants-- therefor On page 5, in Column 2, Item (56) under "Other Publications", Line 57, delete ""Mimimum-dissipation" and insert --"Minimum-dissipation-- therefor On page 6, in Column 2, Item (56) under "Other Publications", Line 38, delete "Seria" and insert --Serial-- therefor On page 6, in Column 2, Item (56) under "Other Publications", Line 53, after ""European", insert --Application--

On page 7, in Column 2, Item (56) under "Other Publications", Line 16, delete "201680038134 X" and insert --201680038134.X-- therefor In the Claims In Column 30, Line 13, in Claim 10, after "system", insert --to--

In Column 31, Line 15, in Claim 18, delete "LAMFE" and insert --LAMEE-- therefor Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*